(12) United States Patent
Tachibana et al.

(10) Patent No.: US 7,005,189 B1
(45) Date of Patent: Feb. 28, 2006

(54) LAMINATE AND ITS PRODUCTION METHOD

(75) Inventors: Yuko Tachibana, Kanagawa (JP); Hisashi Ohsaki, Kanagawa (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 09/857,209

(22) PCT Filed: Dec. 27, 1999

(86) PCT No.: PCT/JP99/07344

§ 371 (c)(1), (2), (4) Date: Jun. 22, 2001

(87) PCT Pub. No.: WO00/40402

PCT Pub. Date: Jul. 13, 2000

(30) Foreign Application Priority Data

Dec. 28, 1998 (JP) .................................. 10-374186

(51) Int. Cl.
*B32B 17/06* (2006.01)

(52) U.S. Cl. ...................... 428/432; 428/336; 428/469; 428/472; 428/673; 428/698; 428/699; 428/701; 428/702

(58) Field of Classification Search ................ 428/336, 428/432, 447, 448, 450, 469, 472, 672, 673, 428/674, 698, 699, 701, 702; 427/164, 165
See application file for complete search history.

(56) References Cited

U.S. PATENT DOCUMENTS

| 3,962,488 | A |   | 6/1976 | Gillery |
| 4,379,040 | A |   | 4/1983 | Gillery |
| 4,565,719 | A | * | 1/1986 | Phillips et al. ................. 428/34 |
| 4,721,349 | A |   | 1/1988 | Fan et al. |
| 5,085,926 | A | * | 2/1992 | Iida et al. .................... 428/216 |
| 5,110,662 | A |   | 5/1992 | Depauw et al. |
| 5,143,796 | A | * | 9/1992 | Sebastiano et al. ......... 428/623 |

(Continued)

FOREIGN PATENT DOCUMENTS

| EP | 0 303 587 | 2/1989 |
| EP | 0 448 522 | 9/1991 |
| GB | 2 080 339 | 7/1980 |
| JP | 54-127990 | 10/1979 |
| JP | 55-11803 | 1/1980 |
| JP | 1-128829 | 5/1989 |
| JP | 1-249330 | 10/1989 |

(Continued)

*Primary Examiner*—Terrel Morris
*Assistant Examiner*—Andrew T Piziali
(74) *Attorney, Agent, or Firm*—Oblon, Spivak, McClelland, Maier & Neustadt, P.C.

(57) ABSTRACT

A laminate having improved visible light transmittance and abrasion resistance, which comprises a substrate, and a titanium oxide layer, a metal layer and a titanium oxide layer laminated alternately in this order on the substrate in (2n+1) layers (wherein n is a positive integer), wherein an interlayer having a refractive index of less than 2.4 at a wavelength of 550 nm is interposed at at least one interlaminar boundary between the titanium oxide layer and the metal layer.

10 Claims, 21 Drawing Sheets

U.S. PATENT DOCUMENTS

| | | | |
|---|---|---|---|
| 5,595,825 A * | 1/1997 | Guiselin | 428/428 |
| 5,691,044 A * | 11/1997 | Oyama et al. | 428/216 |
| 5,723,075 A * | 3/1998 | Hayasaka et al. | 252/587 |
| 5,948,538 A * | 9/1999 | Brochot et al. | 428/432 |
| 6,045,896 A * | 4/2000 | Boire et al. | 428/216 |
| 6,074,732 A * | 6/2000 | Garnier et al. | 181/289 |
| 6,255,031 B1 * | 7/2001 | Yao et al. | 430/270.1 |
| 6,358,617 B1 | 3/2002 | Ohsaki et al. | |

FOREIGN PATENT DOCUMENTS

| | | | |
|---|---|---|---|
| JP | 3-178430 | | 8/1991 |
| JP | 7-43524 | | 2/1995 |
| JP | 07-043524 | * | 2/1995 |
| JP | 7-138048 | | 5/1995 |
| JP | 7-199812 | | 8/1995 |
| JP | 9-104085 | | 4/1997 |
| JP | 9-305126 | | 11/1997 |
| JP | 10-278159 | | 10/1998 |
| JP | 11-64603 | | 3/1999 |
| JP | 11-124689 | | 5/1999 |
| JP | 11-340678 | | 12/1999 |
| WO | WO 96/41215 | | 12/1996 |

* cited by examiner

LAMINATE AND ITS PRODUCTION METHOD

TECHNICAL FIELD

The present invention relates to a laminate having titanium oxide layers and its production method.

BACKGROUND ART

A laminate having metal layers laminated on a transparent substrate such as glass (hereinafter referred to as "metal-containing laminate") is widely used for e.g. window glass of buildings and automobiles with a purpose of e.g. suppressing emission of heat ray to decrease a load on air conditioning. Further, the metal-containing laminate is used also as a shielding material to suppress leakage of electromagnetic wave radiating from an apparatus such as a plasma display.

In a case where the metal-containing laminate is applied to e.g. window glass, a high visible light transmittance is required together with a small emission of heat ray, and at the same time, a low visible light reflectance and a preferred reflection color tone are required.

Further, in a case where the metal-containing laminate is used as an electromagnetic wave shielding material, together with a high electrical conductivity, a visible light transmittance as high as possible and a visible light reflectance as low as possible, and further, a preferred reflection color tone are required.

With respect to the metal-containing laminate, it is required that the wavelength range showing a low reflectance is broad in the visible light region in order to obtain a low visible light reflectance and a preferred reflection color tone.

Further, it is well known that a laminate having a layer constitution wherein dielectric material layers and metal layers are alternately laminated one on another is suitable to obtain a high visible light transmittance together with a low emissivity and an electrical conductivity.

A low heat ray emissivity (i.e. a high electrical conductivity) alone can be obtained by making the metal layer thick. However, it may cause decrease in the visible light transmittance and increase in the visible light reflectance. Further, the wavelength range in which a low reflectance can be obtained in the visible light region tends to be narrow, whereby a preferred reflection color tone may be impaired.

It is generally known that a phenomenon caused by making the metal layer thick (the above unfavorable phenomenon that the reflection color tone is impaired) can be diminished in a case where a material having a high refractive index such as titanium oxide is used as the dielectric material layer, as compared with a case where a material having a refractive index lower than that of titanium oxide is used.

Further, it is generally known that the phenomenon caused by making the metal layer thick can be diminished also in a case where the number of lamination is increased.

Actually, when a laminate is constituted by using titanium oxide layers as the dielectric material layers, the wavelength width in which a low reflectance can be obtained in the visible light region can be broadened as compared with a case of using a material having a refractive index lower than that of titanium oxide, whereby a more preferred reflection color tone can be obtained. However, there is such a problem that the visible light transmittance tends to decrease, and further, the rate of decrease in the visible light transmittance tends to increase together with the increase in the number of lamination.

Further, there is such a problem that a laminate constituted by using titanium oxide layers as the dielectric material layers has a low abrasion resistance.

It is an object of the present invention to improve the transmittance in the visible light region with respect to a laminate employing a titanium oxide.

Further, it is an object of the present invention to improve abrasion resistance with respect to a laminate employing a titanium oxide.

DISCLOSURE OF THE INVENTION

The present invention provides a laminate which comprises a substrate, and a titanium oxide layer, a metal layer and a titanium oxide layer laminated alternately in this order on the substrate in (2n+1) layers (wherein n is a positive integer), wherein an interlayer having a refractive index of less than 2.4 at a wavelength of 550 nm is interposed at at least one interlaminar boundary between the titanium oxide layer and the metal layer.

The present invention further provides a method for producing a laminate comprising a substrate, and a titanium oxide layer, a metal layer and a titanium oxide layer laminated alternately in this order on the substrate in (2n+1) layers (wherein n is a positive integer), which comprises a step of interposing an interlayer having a refractive index of less than 2.4 at a wavelength of 550 nm at at least one interlaminar boundary between the titanium oxide layer and the metal layer.

BEST MODE FOR CARRYING OUT THE INVENTION

Figure 1:
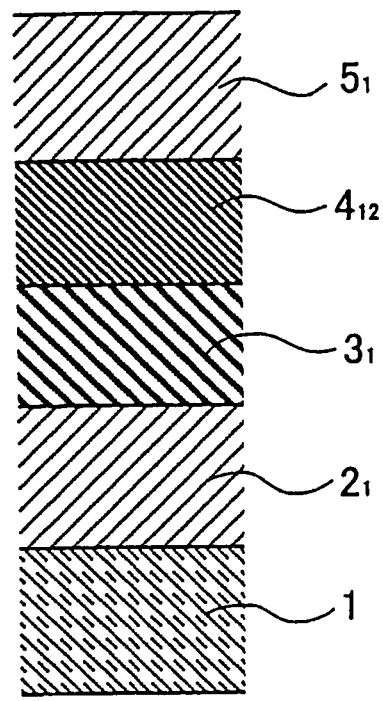
FIG. 1 is a diagrammatical cross-sectional view illustrating a layer constitution of laminates produced in Examples 1 to 5, 18 to 19, 63 to 68 and 81 to 89.

In a constitution wherein titanium oxide layers and metal layers are alternately laminated, when the number of lamination is increased, the wavelength width in which a low reflectance can be obtained in the visible light region will increase. However, it was confirmed that the tendency of decrease in transmittance becomes significant along with increase in the number of lamination, more than expected from optical interference effect. The present inventors have conducted extensive studies on this phenomenon and as a result, found that the decrease in transmittance occurs at the interface between the titanium oxide layer and the metal layer. This phenomenon is estimated to be light absorption due to surface plasmon excited by light irradiation in the inside of the metal layer, particularly in the vicinity of the interface with the titanium oxide layer, and it is considered that formation of the surface plasmon can be suppressed to reduce the decrease in transmittance by interposing a layer having a refractive index lower than that of the titanium oxide as an interlayer.

In the laminate of the present invention, on a first titanium oxide layer on the substrate side, a metal layer and a titanium oxide layer are laminated alternately in pairs. One pair of the metal layer and the titanium oxide layer may be laminated, or a plural pairs may be laminated. For example, the laminate of the present invention may have a layer constitution wherein on a first layer, a metal layer and a titanium oxide layer each in a single layer may be laminated, or may have a layer constitution wherein on a first layer, plurality of metal layers and titanium oxide layers are alternately laminated one on another in this order.

With respect to the laminate of the present invention, the substrate is not particularly limited, and it may, for example, be 1) glass for window made of e.g. soda lime glass, wire glass or frost glass, 2) window glass for vehicles such as automobiles, 3) plastic films of e.g. PET, 4) plastic sheets made of e.g. an acrylic resin, or 5) glass, plastic films and plastic sheets to be used for display. Particularly preferred is a transparent substrate.

Each of the titanium oxide layers in the laminate of the present invention is preferably a layer having a refractive index of at least 2.4 as a wavelength of 550 nm, and may be one consisting of an oxide of titanium (titania) alone or may contain a small amount of another element component other than titanium. As another element component, Nb, Cr or Zr may, for example, be mentioned.

The thickness (geometrical film thickness, the same applies hereinafter) of the first layer on the substrate side and the titanium oxide layer which is located at the furthest from the substrate is preferably from 20 to 60 nm, particularly preferably from 25 to 45 nm. The thickness of the titanium oxide layer other than the first layer and the titanium oxide layer which is located at the furthest from the substrate is preferably from 40 to 120 nm, particularly preferably from 50 to 90 nm. Further, the first layer and the titanium oxide layer which is located at the furthest from the substrate have a thinner film thickness (particularly a thickness at a level of ½) than another titanium oxide layer from the viewpoint to decrease the visible light reflectance and to increase the wavelength range in which a low reflectance can be obtained.

In the laminate of the present invention, the plurality of titanium oxide layers may have the same composition or may have different compositions.

In the laminate of the present invention, the metal layer is preferably a layer containing at least one metal selected from the group consisting of silver, copper and gold. It may be silver, copper, gold or an alloy containing them as the main component.

Specific examples of an alloy containing silver, copper or gold as the main component include 1) a silver-Pd alloy containing Pd in an amount of at most 5.0 atomic % (preferably within a range of from 0.1 to 3 a atomic %), 2) a silver-gold alloy containing Au in an amount of at most 5.0 atomic % (preferably within a range of from 0.1 to 3 atomic %), and 3) a silver-Pd—Cu alloy containing Pd and Cu each in an amount of from 0.5 to 3 atomic %. Here, the above inclusion proportion is a proportion based on the total amount including silver, and the same applies hereinafter.

In a case where the laminate of the present invention has a plurality of metal layers, the metal layers may be layers having the same composition or may be layers having different compositions.

The thickness of the metal layer is preferably from 8 to 30 nm. The thickness of the metal layer which is closest to the substrate and the metal layer which is furthest from the substrate is preferably from 0.5 to 1.0 time the thickness of another metal layer from the viewpoint to decrease the visible light reflectance and to increase the wavelength range in which a low reflectance can be obtained.

Further, in the case where the laminate of the present invention has a plurality of metal layers, the total of the thicknesses (thickness of the plurality of metal layers) is preferably at most 120 nm.

From the viewpoint to decrease the visible light reflectance and to increase the wavelength range in which a low reflectance can be obtained, the number of metal layers is preferably two in a case where the targeted resistance value of the laminate to be obtained is 2.5 Ω/□, it is preferably three in a case where the targeted resistance value is 1.5 Ω/□, and it is preferably four in a case where the targeted resistance value is 0.5 Ω/□.

In the laminate of the present invention, a plurality of interlayers may be interposed, and they may be provided on and below the metal layer so that the metal layer is sandwiched therebetween. Particularly preferred is such a constitution that all metal layers are sandwiched between two interlayers, whereby the highest visible light transmittance can be obtained.

Further, in the laminate of the present invention, a constitution wherein the interlayer is provided on the metal layer is preferred in view of excellence in abrasion resistance. In a case where an interlayer is provided on the metal layer which is furthest from the substrate in the laminate having a plurality of metal layers, the effect to improve the abrasion resistance tends to be significant as compared with a case where the interlayer is laminated on the metal layer which is closest to the substrate. Further, preferred is an interlayer consisting of at least one nitride selected from the group consisting of nitrides of boron, aluminum and silicon, from the viewpoint of abrasion resistance. Preferred is an interlayer consisting of a nitride of boron, aluminum or silicon, particularly silicon nitride (particularly $SiN_x$, x=1.30 to 1.36).

The interlayer may consist of any material so long as it is one having a refractive index of less than 2.4 at a wavelength of 550 nm. Particularly preferred is one made of a material having a refractive index of from 1.6 to 2.39. As the interlayer, preferred is a layer consisting of at least one member selected from the group consisting of an oxide, a nitride, an oxynitride, a carbide and a boride. Specific examples of the material constituting the interlayer include silicon nitride (refractive index: 2.0), niobium oxide (refractive index: 2.35), zinc oxide (refractive index: 2.0) and tin oxide (refractive index: 2.0).

In the laminate of the present invention, the interlayer is not to improve the visible light transmittance due to optical interference effect, and it has an effect with a smaller thickness to cause the optical interference effect. The interlayer suppresses formation of the surface plasmon generated at the interface between the metal layer and the titanium oxide layer to suppress loss of visible light in the laminate generated due to light absorption by the surface plasmon.

Further, at the same time, the upper limit of the thickness of the interlayer (geometrical film thickness) is preferably 30 nm, particularly preferably 10 nm, furthermore preferably 5 nm from the viewpoint to decrease the visible light reflectance and to increase the wavelength range in which a low reflectance can be obtained.

From the viewpoint of abrasion resistance, the upper limit of the thickness of the interlayer is preferably 20 nm, particularly preferably 15 nm.

The lower limit of the thickness of the interlayer is preferably 0.1 nm, particularly preferably 0.5 nm.

In a case where there are a plurality of interlayers, the total of the thicknesses (the thickness of the plurality of interlayers) is preferably at most 40 nm.

With respect to the effect to improve the visible light transmittance relative to the number of interlayers, an additive law is substantially confirmed.

The laminate of the present invention has a high electrical conductivity, and it thereby has an electromagnetic wave shielding property. Further, it has a high reflectance in the near infrared region, it thereby has a near-infrared shielding property also. For example, the transmittance at a wavelength of 900 nm is preferably at most 15%.

With respect to the laminate of the present invention, it is preferred that the sheet resistance value is from 0.5 to 3.5 Ω/□, the visible light transmittance is at least 40%, and the visible light reflectance is at most 10%.

Further, the laminate of the present invention preferably has an emissivity of at most 0.08.

It is also preferred to use the laminate of the present invention with a purpose of suppressing leakage of electromagnetic wave radiating from an electromagnetic wave release source such as a plasma display.

The laminate of the present invention has an electromagnetic wave shield factor at 30 MHz of preferably at least 10 db, particularly preferably at least 15 db, furthermore preferably at least 17 db. When the sheet resistance value is the same, the electromagnetic shield factor is substantially the same.

Further, when the laminate of the present invention is used in an application wherein importance is attached to a low-reflecting property, it is preferred to further laminate a resin film having a low-reflecting property on the laminate, whereby the visible light reflectance can be made to be at most 3%.

Further, when the laminate of the present invention is used in an application wherein importance is attached to a near-infrared shielding property, it is preferred to further laminate a resin film having a near-infrared shielding property, whereby the transmittance at a wavelength of 900 nm can be made to be at most 5%.

The resin film is attached 1) on the multilayer film of the laminate of the present invention and/or 2) on the substrate surface on the side opposite to the substrate surface on which the laminate of the present invention is formed thereon.

As the resin film having a low-reflecting property, one having an antireflection layer formed on a resin film made of e.g. urethane or PET may be mentioned. Said resin film has a shatterproof property together with the low-reflecting property. As the antireflection layer, 1) a low-refractive index layer consisting of an amorphous fluorine-containing polymer (such as Cytop, manufactured by Asahi Glass Company, Limited), 2) a low-refractive index layer made of e.g. $SiO_2$ or $MgF_2$, 3) a multilayer film having low-refractive index layers and high-refractive index layers alternately overlaid one on another, or 4) a porous silica layer may, for example, be mentioned.

As the resin film having a near-infrared shielding property, one having a near-infrared absorbent mixed in a resin film made of e.g. urethane or PET may be mentioned. Further, a near-infrared absorbent may be mixed in an adhesive layer to be used for attachment.

In production of the laminate of the present invention, formation of the titanium oxide layer may be carried out, for example, in accordance with a method of forming it by means of a direct-current sputtering method by using a reducing target of a titanium oxide, a reactive sputtering method, an ion plating method, a vapor deposition method or a CVD method. Among them, the method of forming it by means of a direct-current sputtering method by using a reducing target of a titanium oxide is favorable since oxidation of the metal layer can be prevented when the titanium oxide layer is formed on the metal layer, and a uniform formation can be carried out at a high speed in a large area. Oxidation of the metal layer can be prevented, with the result that the obtained laminate has an improved visible light transmittance and a decreased emissivity.

The reducing target of a titanium oxide is a target having deficient oxygen relative to a stoichiometric composition of the titanium oxide. Specifically, it is preferred to use one having a composition represented by the formula $TiOx$ ($1<x<2$). The reducing target of a titanium oxide may be produced, for example, by a high pressure compression method, a sintering method or a flame spray coating method using a titania powder or a mixture of a titania powder with a titanium powder as a material, as disclosed in International Publication WO97/08359.

In a case of using a reducing target, it is preferred to use, as a sputtering gas, an inert gas containing from 0.1 to 10 vol % of an oxidizing gas. Use of an inert gas containing an oxidizing gas at a concentration within this range as a sputtering gas is effective to suppress oxidation of the metal layer when the titanium oxide layer is formed, and is effective to produce a laminate having a low emissivity and a high electrical conductivity. It is particularly preferred to use an inert gas containing from 0.1 to 5 vol % of an oxidizing gas.

As the oxidizing gas, oxygen gas may commonly be used, and e.g. nitrogen monoxide, nitrogen dioxide, carbon monoxide, carbon dioxide or ozone may be used.

Formation of the metal layer can be carried out in accordance with e.g. a sputtering method, a CVD method or a vapor deposition method. Particularly preferred is formation by a direct-current sputtering method since the film-formation rate is high, and a layer having a uniform quality can be formed in a uniform thickness in a large area.

Formation of the interlayer can be carried out in accordance with a method properly selected depending on the composition of the layer to be formed. For example, it may be carried out by e.g. a sputtering method, a CVD method or a vapor deposition method. Particularly preferred is a direct-current sputtering method.

The laminate of the present invention can be used for heat shielding articles (such as heat shielding window glass), optical filters (such as near-infrared shielding filters to be disposed in front of PDP), electromagnetic wave shielding articles (such as electromagnetic wave shielding plate to be disposed in front of PDP), low-reflecting articles (such as low-reflecting window glass and low-reflecting displays), heat ray-reflecting plates and transparent electrodes.

EXAMPLES

Now, the present invention will be described in further detail with reference to Examples and Comparative Examples. In the following Examples and Comparative Examples, measurement of the visible light transmittance and emissivity and evaluation of the abrasion resistance were carried out in accordance with the following methods.

Measurement of Visible Light Transmittance and Visible Light Reflectance

The spectral transmittance and the spectral reflectance at a wavelength of from 340 to 780 nm were measured, and the visible light transmittance and the visible light reflectance were obtained by the relative luminous efficiency of CIE light adaptation relative to CIE standard light $D_{65}$ as specified in JIS Z8720, in accordance with JIS R3106.

Measurement of Emissivity

In accordance with JIS R3106, with respect to a standard sample of which the hemisphere emissivity was preliminarily obtained, the emissiometer value was measured by SCALING DEGITAL VOLTMETER (common name: emissiometer) manufactured by Devices & Services, and the conversion factor between the hemisphere emissivity and the emissiometer value was preliminarily obtained.

With respect to samples obtained in Examples and Comparative Examples, the emissiometer value was measured, and the emissiometer value was multiplied by the above conversion factor to obtain the hemisphere emissivity.

Evaluation of Abrasion Resistance

In accordance with JIS K5400, a scratch value by pencil with a load of 1 kg was measured, and employed as an index of the abrasion resistance.

Example 1

Using a target (area: 432 mm×127 mm) consisting of TiOx (x=1.94), a titania layer (refractive index: 2.45) having a thickness of 33 nm was formed on the surface of a soda lime glass, with an application electric power of 4 kw by using argon gas containing 2 vol % of oxygen as a sputtering gas. Here, the proportion of oxygen is a proportion based on the entire sputtering gas, and the same applies hereinafter.

On the titania layer, a metal layer consisting of silver containing 1 atomic % of Pd (hereinafter referred to simply as "Ag-1 at % Pd layer") (thickness: 14 nm) was formed by using a target (area: 432 mm×127 mm) consisting of silver containing 1 atomic % of palladium by using argon gas as a sputtering gas by applying an electric power of 0.3 kw. Here, the proportion of palladium in the target is a proportion based on the total amount with silver, and the same applies hereinafter.

Further, on the Ag-1 at % Pd layer, an interlayer consisting of silicon nitride ($SiN_x$, x=1.34) (hereinafter referred to as "$SiN_x$ interlayer") (refractive index: 1.95, thickness: 0.5 nm) was formed by using Si (area: 432 mm×127 mm) as a target, by using argon gas containing 30 vol % of nitrogen as a sputtering gas with an application electric power of 1 kW. Then, on the interlayer, a titania layer having a thickness of 33 nm was formed in the same manner as mentioned above to obtain a laminate A-1. Here, a laminate obtained in Example X will be referred to as "laminate A–X" below.

The obtained laminate A-1 has a constitution wherein on a soda lime glass $1$, a titania layer $2_1$, a Ag-1 at % Pd layer $3_1$, a $SiN_x$ interlayer $4_{12}$ and a titania layer $5_1$ sequentially laminated, as illustrated in FIG. 1.

In FIG. 1 designates a soda lime glass, $2_1$ designates a titania layer, $3_1$, $3_2$, $3_3$ and $3_4$ designate a Ag-1 at % Pd layer, $4_{11}$, $4_{12}$, $4_{21}$, $4_{22}$, $4_{31}$, $4_{32}$, $4_{41}$ and $4_{42}$ designate an interlayer, $5_1$, $5_2$, $5_3$ and $5_4$ designate a titania layer, $6$ designates a top coat layer, $7$ designates a bottom coat layer and $8$ designates a resin film.

Of the laminate A-1, the visible light transmittance, the visible light reflectance, the sheet resistance value and the emissivity are shown in Table 1.

Comparative Example 1

Figure 2:
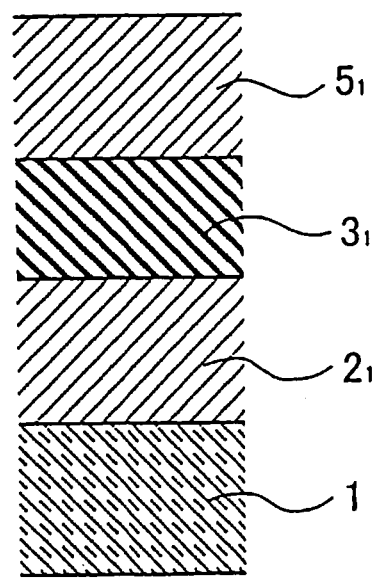
FIG. 2 is a diagrammatical cross-sectional view illustrating a layer constitution of a laminate produced in Comparative Example 1.

A laminate B-1 having a constitution wherein on a soda lime glass $1$, a titania layer $2_1$ having a thickness of 33 nm, a Ag-1 at % Pd layer $3_1$ having a thickness of 14 nm and a titania layer $5_1$ having a thickness of 33 nm were formed, as illustrated in FIG. 2, was obtained in the same manner as in Example 1 except that no $SiN_x$ interlayer $4_{12}$ was formed. Here, a laminate obtained in Comparative Example Y will be referred to as "laminate B–Y" below.

Of the obtained laminate B-1, the visible light transmittance, the visible light reflectance, the sheet resistance value and the emissivity are shown in Table 1.

Examples 2 to 17 and Comparative Examples 2 to 5

Laminates A-2 to A-17 and laminates B-2 to B-5 were produced in the same manner as in Example 1 by changing the thickness of the SiN, interlayer within a range of from 0.5 to 5 nm and by changing the position to which the interlayer was formed, as identified in Tables 1 and 2.

The laminates A-2 to A-5 (Examples 2 to 5) have a constitution wherein on a soda lime glass $1$, a titania layer $2_1$, a Ag-1 at % Pd layer $3_1$, a $SiN_x$ interlayer $4_1$ and a titania layer $5_1$ were sequentially laminated, as illustrated in FIG. 1.

Figure 3:
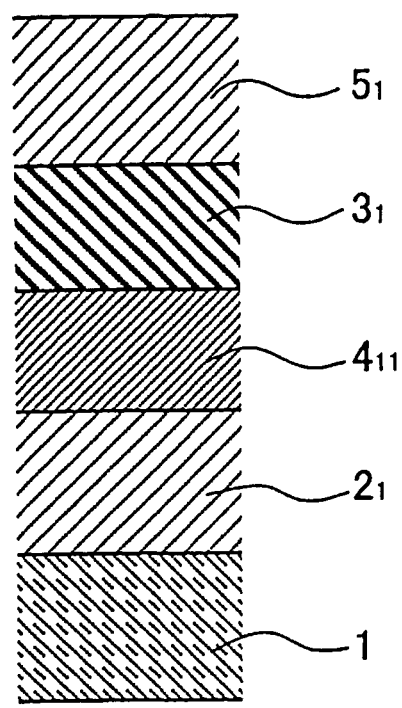
FIG. 3 is a diagrammatical cross-sectional view illustrating a layer constitution of laminates produced in Examples 6 to 12, 20 to 21, 69 to 72, 90 to 100, 122 to 126 and 127 to 131.

The laminates A-6 to A-12 (Examples 6 to 12) have a constitution wherein on a soda lime glass $1$, a titania layer $2_1$, a $SiN_x$ interlayer $4_{11}$, a Ag-1 at % Pd layer $3_1$ and a titania layer $5_1$ were sequentially laminated, as illustrated in FIG. 3.

Figure 4:
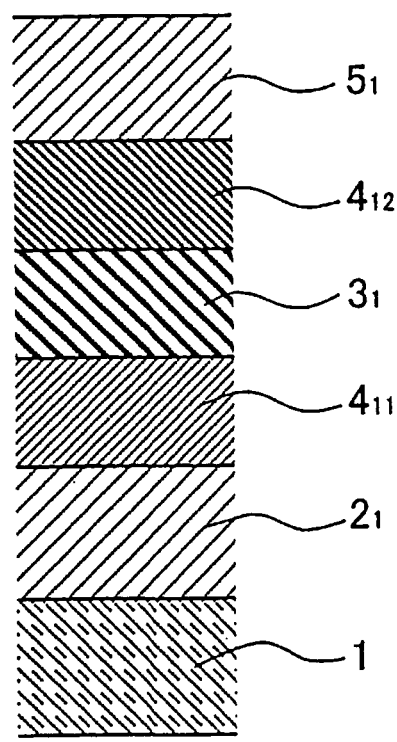
FIG. 4 is a diagrammatical cross-sectional view illustrating a layer constitution of laminates produced in Examples 13 to 17 and 73 to 80.

The laminates A-13 to A-17 (Examples 13 to 17) have a constitution wherein on a soda lime glass $1$, a titania layer $2_1$, a $SiN_x$, interlayer $4_{11}$, a Ag-1 at % Pd layer $3_1$, a $SiN_x$ interlayer $4_{12}$ and a titania layer $5_1$ were sequentially laminated, as illustrated in FIG. 4.

Figure 5:
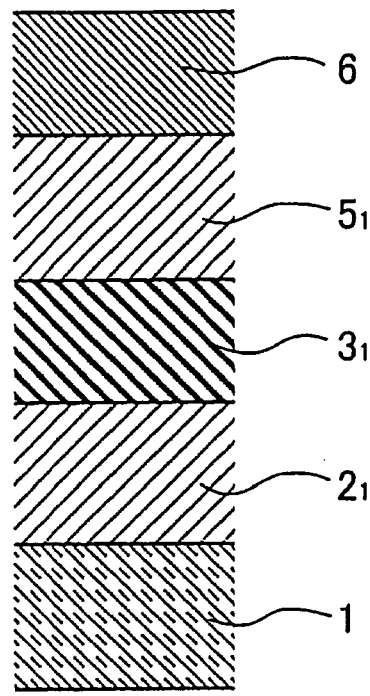
FIG. 5 is a diagrammatical cross-sectional view illustrating a layer constitution of laminates produced in Comparative Examples 2 to 3.

The laminates B-2 and B-3 (Comparative Examples 2 and 3) have a constitution wherein on a soda lime glass $1$, a titania layer $2_1$, a Ag-1 at % Pd layer $3_1$, a titania layer $5_1$ and a top coat layer $6$ consisting of $SiN_x$ were sequentially laminated, as illustrated in FIG. 5.

Figure 6:
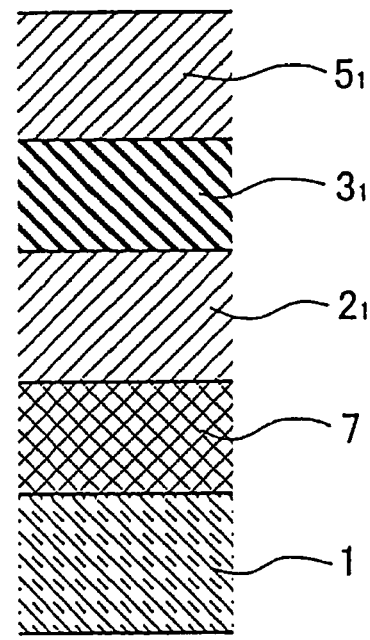
FIG. 6 is a diagrammatical cross-sectional view illustrating a layer constitution of laminates produced in Comparative Examples 4 to 5.

The laminates B-4 and B-5 (Comparative Examples 4 and 5) have a constitution wherein on a soda lime glass $1$, a bottom coat layer $7$ consisting of $SiN_x$, a titania layer $2_1$, a Ag-1 at % Pd layer $3_1$ and a titania layer $5_1$ were sequentially laminated, as illustrated in FIG. 6.

Here, each of the top coat layer consisting of $SiN_x$ and the bottom coat layer consisting of $SiN_x$ was formed by the same formation method of the $SiN_x$, interlayer.

With respect to the obtained laminates A-2 to A-17 and the laminates B-2 to B-5, the visible light transmittance, the visible light reflectance, the sheet resistance value and the emissivity were measured. The results are shown in Tables 1 and 2.

Figure 7:
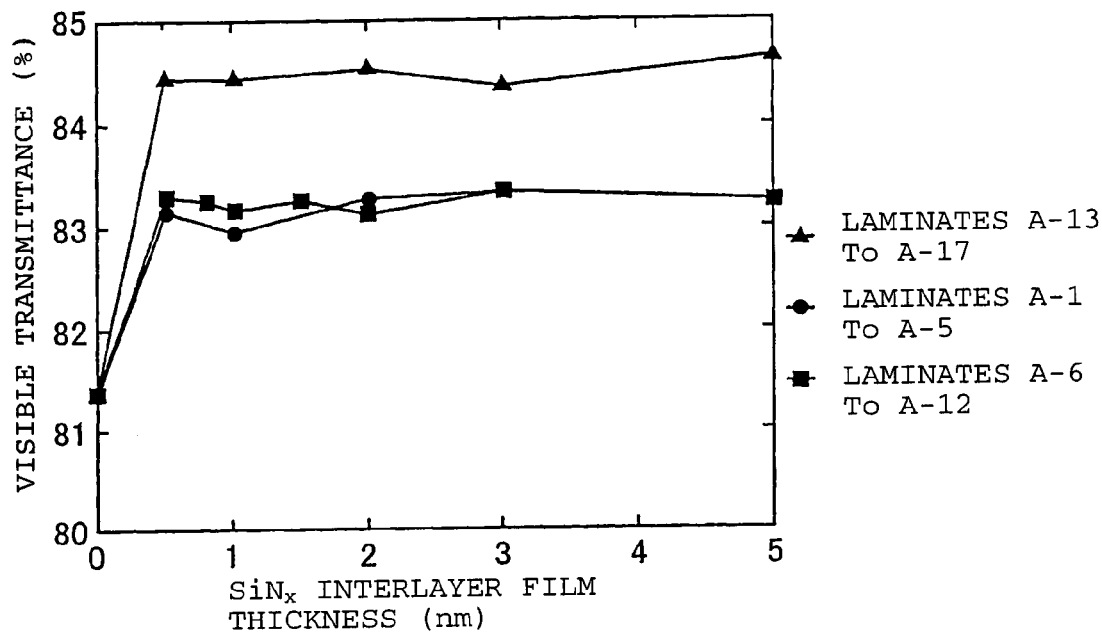
FIG. 7 is a diagram illustrating the relation between thicknesses of interlayers and visible light transmittances of laminates produced in Examples 1 to 17.

Further, the relation between the thicknesses of the interlayers and the visible light transmittances of the laminates A-1 to A-17 are illustrated in FIG. 7. In FIG. 7, the laminates A-1 to A-5 having the $SiN_x$ interlayer $4_{12}$ on the Ag-1 at % Pd layer $3_1$ are represented by ●, the laminates A-6 to A-12 having the $SiN_x$ interlayer $4_{11}$ below the Ag-1 at % Pd layer $3_1$ are represented by ■, and the laminates A-13 to A-17 having the $SiN_x$ interlayers $4_{11}$ and $4_{12}$ on and below the Ag-1 at % Pd layer $3_1$ are represented by ▲.

Figure 8:
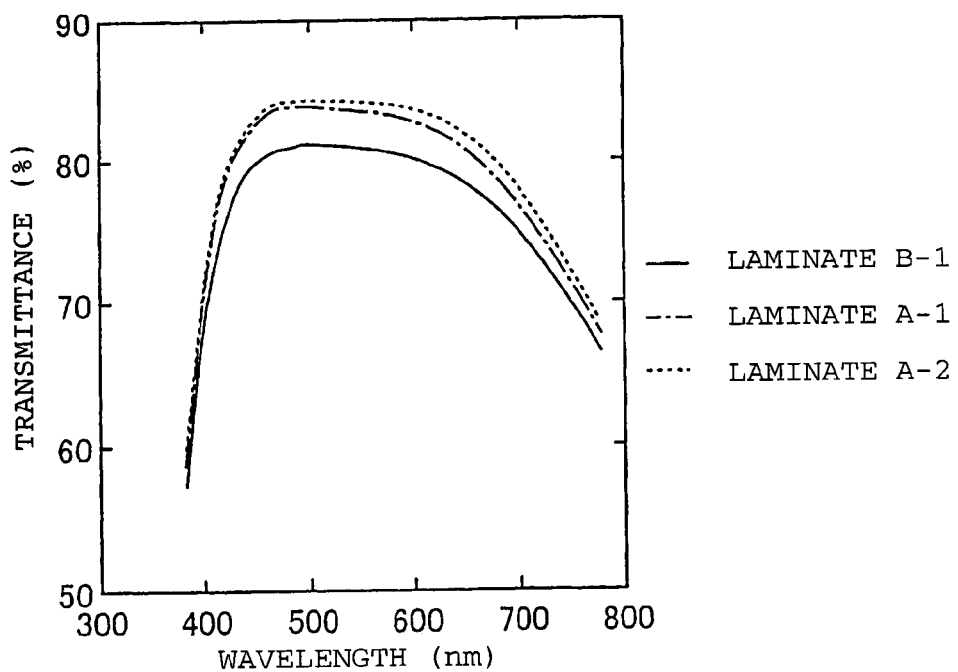
FIG. 8 is a diagram illustrating visible spectral characteristics of laminates produced in Examples 1 to 2 and Comparative Example 1.

Further, the visible spectral characteristics of the laminates A-1 and A-2 are shown in FIG. 8 together with the visible spectral characteristics of the laminate B-1.

Figure 9:
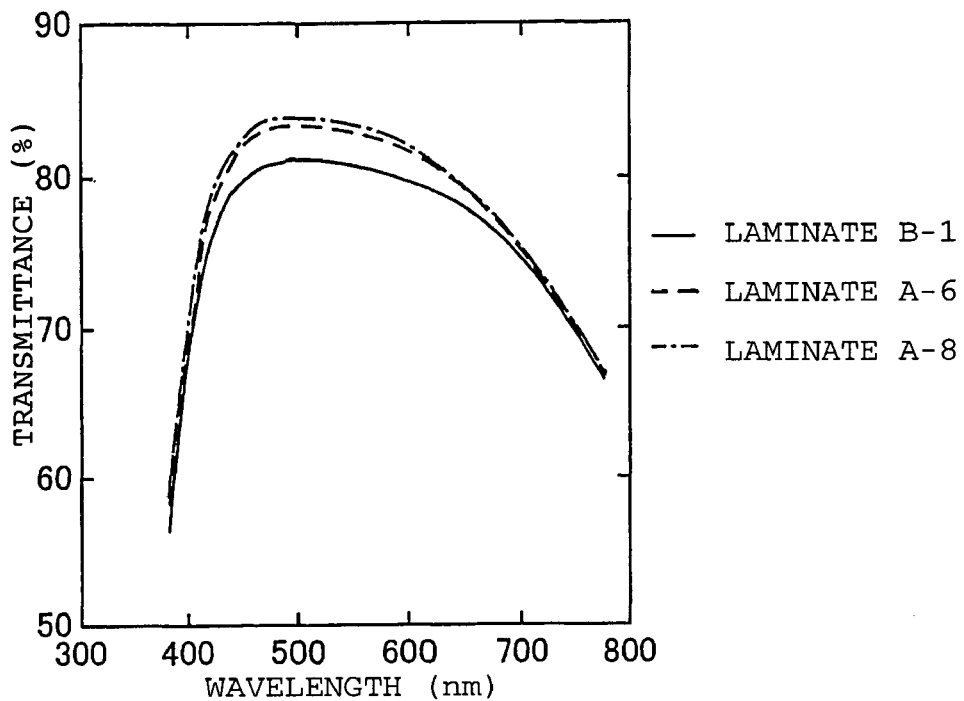
FIG. 9 is a diagram illustrating visible spectral characteristics of laminates produced in Examples 6 and 8 and Comparative Example 1.

Still further, the visible spectral characteristics of the laminates A-6 and A-8 are shown in FIG. 9 together with the visible spectral characteristics of the laminate B-1.

Figure 10:
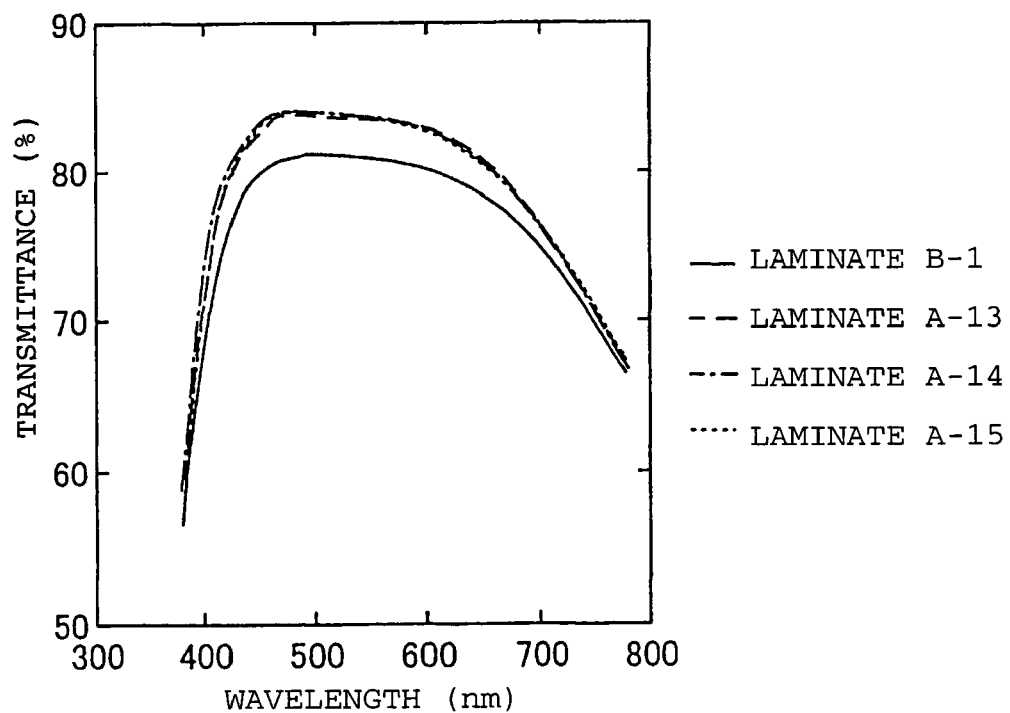
FIG. 10 is a diagram illustrating visible spectral characteristics of laminates produced in Examples 13 to 15 and Comparative Example 1.

Further, the visible spectral characteristics of the laminates A-13, A-14 and A-15 are shown in FIG. 10 together with the visible spectral characteristics of the laminate B-1.

As evident from the results shown in Table 1 and FIG. 7, the laminates having a constitution wherein $SiN_x$ interlayers are formed on and bellow the Ag-1 at % Pd layer, show a higher visible light transmittance than the laminate having a constitution wherein an interlayer is formed only on or below the Ag-1 at % Pd layer, and show a visible light transmittance higher by about 3% as compared with the laminate B-1 having a constitution with no interlayer of Comparative Example 1. The effect can be obtained with a film thickness of the SiN, interlayer of 0.5 nm, and the effect does not depend on the film thickness. The bottom coat of $SiN_x$ before film formation of the first titania layer and the top coat of $SiN_x$ as the outermost layer have substantially no effect to improve the transmittance.

Examples 18 to 21

Laminates A-18 to A-21 were produced in the same manner as in Example 1 except that the thickness or the position of the $SiN_x$ interlayer was changed as identified in Table 3.

With respect to the obtained laminates A-18 to 21, the abrasion resistance was evaluated. Further, the laminates obtained in Examples 1, 2, 4, 5, 8, 11 and 12 and Comparative Example 1 were also evaluated similarly. The results are shown in Table 3.

It is found from the results as shown in Table 3 that of the laminates having a layer constitution wherein a $SiN_x$ interlayer having a thickness of at least 0.5 nm was formed on the Ag-1 at % Pd layer, the pencil scratch value as an index of the abrasion resistance is improved. Further, it is found that of the laminates having a layer constitution wherein a $SiN_x$ interlayer having a thickness of at least 1 nm was formed below the Ag-1 at % Pd layer, the pencil scratch value as an index of the abrasion resistance is improved. Further, it is found that the laminates having a layer constitution wherein an interlayer is formed on the Ag-1 at % Pd layer have a greater effect to improve the pencil scratch value, and the pencil scratch value is further improved by increasing the thickness of the interlayer.

Example 22

Figure 11:
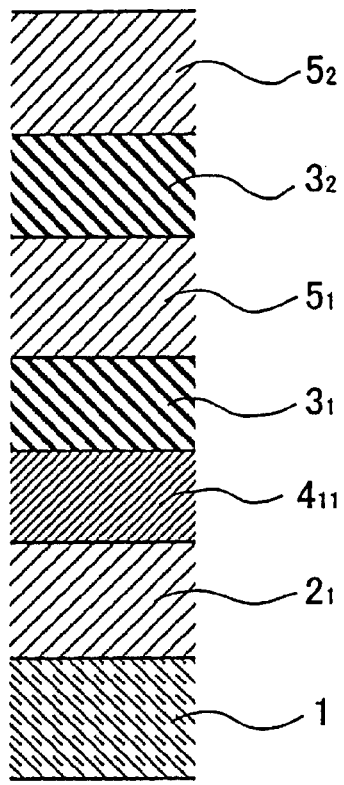
FIG. 11 is a diagrammatical cross-sectional view illustrating a layer constitution of laminates produced in Examples 22 to 23 and 101 to 102.

In the same manner as in Example 1, a laminate A-22 having a constitution as illustrated in FIG. 11 was produced by sequentially laminating, on a soda lime glass 1, a titania layer $2_1$ having a thickness of 33 nm, a $SiN_x$ interlayer $4_{11}$ having a thickness of 1 nm, a Ag-1 at % Pd layer $3_1$ having a thickness of 14 nm and a titania layer $5_1$ having a thickness of 66 nm, and further laminating a Ag-1 at % Pd layer $3_2$ having a thickness of 14 nm and a titania layer $5_2$ having a thickness of 33 nm.

Of the obtained laminate A-22, the visible light transmittance, the visible light reflectance, the sheet resistance value and the emissivity are shown in Table 4 (No. 1).

Comparative Example 6

Figure 12:
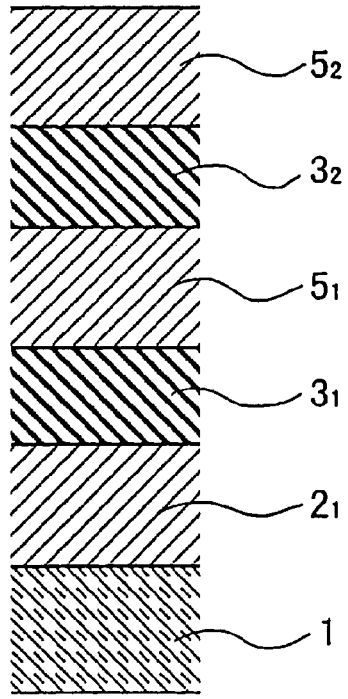
FIG. 12 is a diagrammatical cross-sectional view illustrating a layer constitution of laminate produced in Comparative Example 6.

A laminate B-6 having a constitution as illustrated in FIG. 12 was produced in the same manner as in Example 22 except that no interlayer $4_{11}$ was formed.

Of the obtained laminate B-6, the visible light transmittance, the visible light reflectance, the sheet resistance value and the emissivity are shown in Table 4.

Examples 23 to 44

Laminates A-23 to A-40 were produced in the same manner as in Example 22 except that the thickness or the position of the $SiN_x$ interlayer was changed as identified in Table 4 (Nos. 1 and 2).

Figure 13:
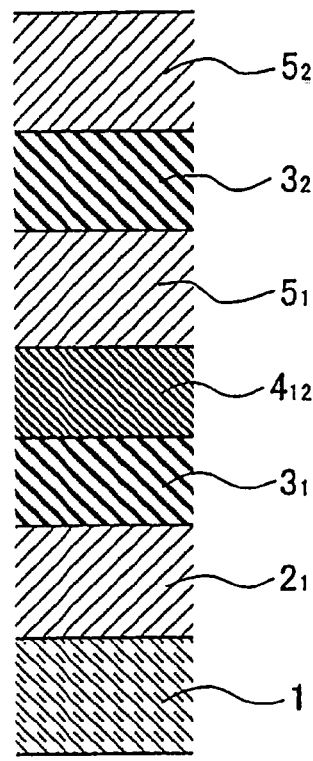
FIG. 13 is a diagrammatical cross-sectional view illustrating a layer constitution of laminates produced in Examples 24 to 25 and 103 to 104.
Figure 14:
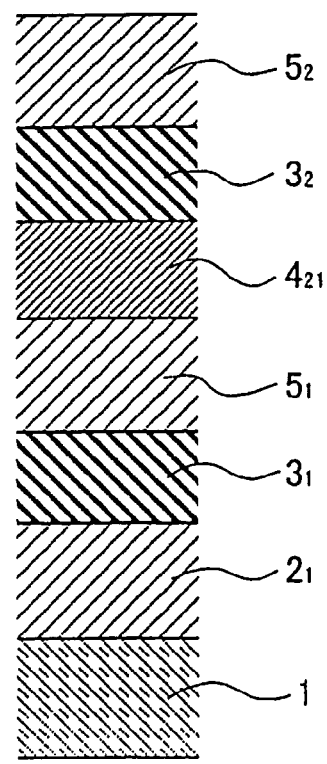
FIG. 14 is a diagrammatical cross-sectional view illustrating a layer constitution of laminates produced in Examples 26 to 27 and 105 to 106.
Figure 15:
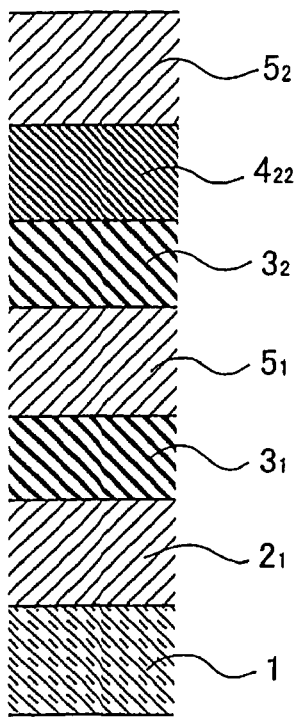
FIG. 15 is a diagrammatical cross-sectional view illustrating a layer constitution of laminates produced in Examples 28 to 29 and 107 to 108.
Figure 16:
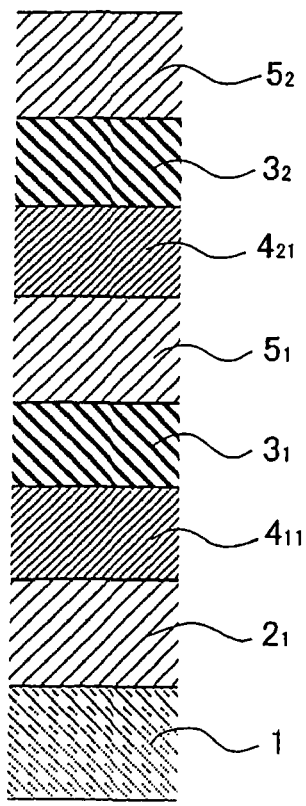
FIG. 16 is a diagrammatical cross-sectional view illustrating a layer constitution of laminates produced in Examples 30 to 31 and 109 to 110.
Figure 17:
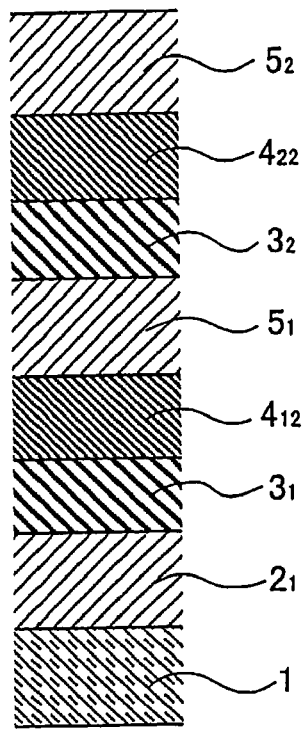
FIG. 17 is a diagrammatical cross-sectional view illustrating a layer constitution of laminates produced in Examples 32 to 33 and 111 to 112.
Figure 18:
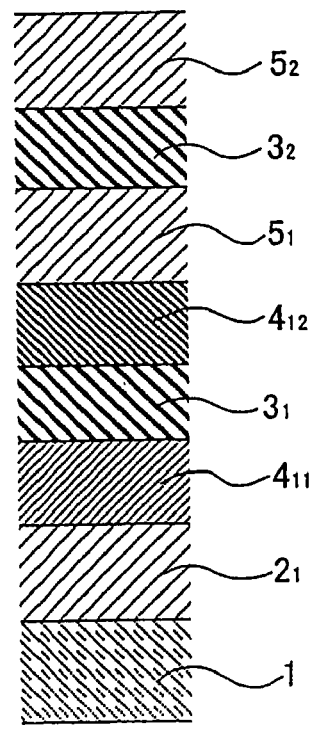
FIG. 18 is a diagrammatical cross-sectional view illustrating a layer constitution of laminates produced in Examples 34 to 35 and 113 to 114.
Figure 19:
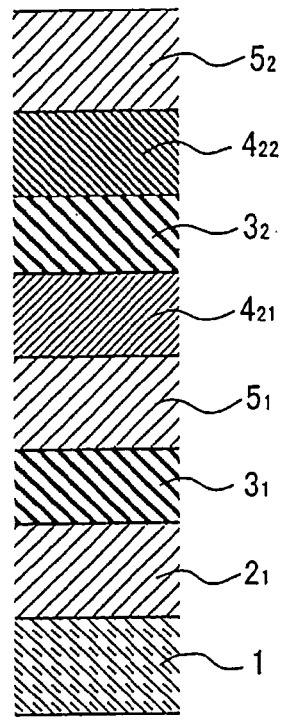
FIG. 19 is a diagrammatical cross-sectional view illustrating a layer constitution of laminates produced in Examples 36 to 37 and 115 to 116.
Figure 20:
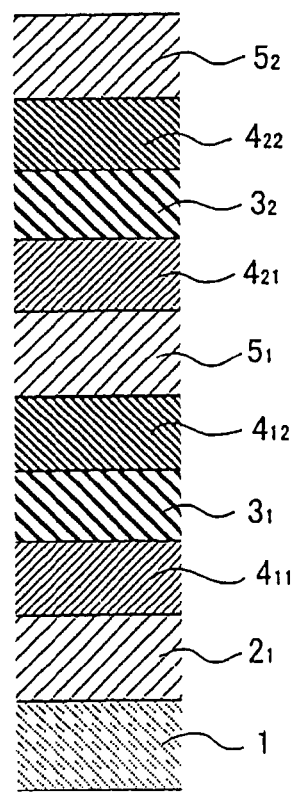
FIG. 20 is a diagrammatical cross-sectional view illustrating a layer constitution of laminates produced in Examples 38 to 40 and 117 to 121.

The laminate A-23 (Example 23) has a constitution as illustrated in FIG. 11, the laminates A-24 and A-25 (Examples 24 and 25) in FIG. 13, the laminates A-26 and A-27 in FIG. 14, the laminates A-28 and A-29 in FIG. 15, the laminates A-30 and A-31 in FIG. 16, the laminates A-32 and A-33 in FIG. 17, the laminates A-34 and A-35 in FIG. 18, the laminates A-36 and A-37 in FIG. 19 and the laminates A-38 to A-40 in FIG. 20, respectively.

With respect to the laminates A-23 to A-40, the visible light transmittance, the visible light reflectance, the sheet resistance value and the emissivity are measured. They are shown in Table 4 (Nos. 1 and 2) together with the results of the laminate B-6.

Figure 21:
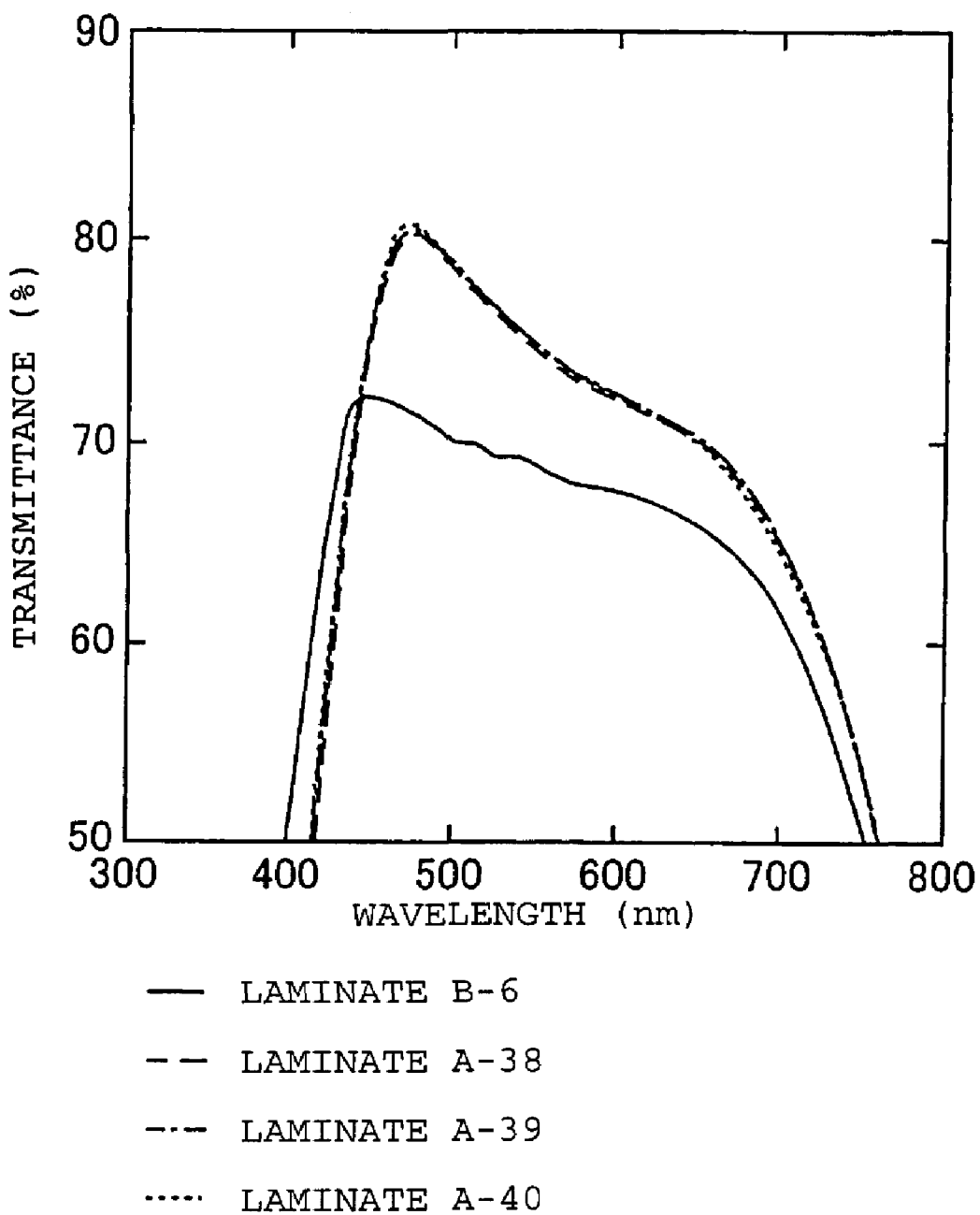
FIG. 21 is a diagram illustrating visible spectral characteristics of laminates produced in Examples 38 to 40 and Comparative Example 6.

Further, the visible spectral characteristics of the laminates A-38, A-39 and A-40 are shown in FIG. 21 together with the visible spectral characteristics of the laminates B-6. Here, the sheet resistance value was measured before a low-reflection resin film was attached. The same applies hereinafter.

The laminates having a $SiN_x$ interlayer formed on and below the two Ag-1 at % Pd layers show the highest visible light transmittance, and show a visible light transmittance higher by about 6% as compared with the laminate having no $SiN_x$ interlayer formed of Comparative Example 6. The effect can be obtained with a film thickness of the $SiN_x$ interlayer of 1 nm, and the effect does not depend on the film thickness.

In order to obtain a laminate having a sheet resistance value of 2.5 Ω/□ and a visible light transmittance of at least 74%, it is preferred to form a $SiN_x$ interlayer on and below a Ag-1 at % Pd layer, and preferred is a laminate wherein the (2n+1) layers are five layers.

Further, with respect to the laminate A-38, the transmittance of light having a wavelength of 900 nm and the electromagnetic wave shield factor at a frequency of 30 MHz were measured, and they were 14.5% and 15 dB, respectively. From these results, it is found that the laminate A-38 has good near-infrared shielding property and electromagnetic wave shielding property. EXAMPLES 38a, 39a and 40a.

Laminates A-38a, A-39a and A-40a were produced in the same manner as in Examples 38, 39 and 40, respectively, except that metal layers made of silver containing 1 atomic % each of Pd and Cu (hereinafter referred to simply as "Ag-1 at % Pd-1 at % Cu layer") were formed by using a target (area: 432 mm×127 mm) consisting of silver containing 1 atomic % of palladium and 1 atomic % of copper by using argon gas as a sputtering gas by charging an electric power of 0.3 kw, instead of the Ag-1 at % Pd layers formed by using the target (area: 432 mm×127 mm) consisting of silver containing 1 atomic % of palladium. The obtained laminates were evaluated in the same manner as the laminate A-38. The results are shown in Table 4 (No. 3).

Comparative Example 6a

A laminate was obtained in the same manner as the laminate A-38a of Example 38a except that no interlayer was formed, and the obtained laminate was evaluated in the same manner as the laminate A-38. The results are shown in Table 4 (No. 3).

With the laminates using Ag-1 at % Pd-1 at % Cu layers, the same good results can be obtained as the laminate using Ag-1 at % Pd layers.

Further, it was confirmed that humidity resistance was improved due to the synergistic effect of the two types of metals (Pd and Cu) contained in silver, as compared with the case where one type of metal is contained.

Examples 38b, 39b and 40b

Laminates A-38b, A-39b and A-40b were produced in the same manner as in Examples 38, 39 and 40, respectively, except that metal layers consisting of silver containing 1 atomic % of Au (hereinafter referred to simply as "Ag-1 at % Au layer") were formed by using a target (area: 432 mm×127 mm) consisting of silver containing 1 atomic % of gold by using argon gas as a sputtering gas by charging an electric power of 0.3 kw, instead of the Ag-1 at % Pd layers formed by using the target (area: 432 mm×127 mm) consisting of silver containing 1 atomic % of palladium. The obtained laminates were evaluated in the same manner as the laminate A-38. The results are shown in Table 4 (No. 4).

Comparative Example 6b

A laminate was produced in the same manner as the laminate A-38b of Example 38b except that no interlayer was formed, and the obtained laminate was evaluated in the same manner as the laminate A-38. The results are shown in Table 4 (No. 4).

With the laminates using Ag-1 at % Au layers, the same good results can be obtained as the laminate using Ag-1 at % Pd layers. Further, with the laminate using Ag-1 at % Au layers, a visible light transmittance higher by about 2% as compared with the laminate using Ag-1 at % Pd layers can be obtained, and at the same time, a sheet resistance value lower by about 10% can be obtained when a film thickness of the metal layer is at the same level.

Example 41

A resin film having a low-reflecting property, comprising a polyurethane type soft resin film (thickness: 200 µm), and a low-refractive index antireflection layer consisting of an amorphous fluorine-containing polymer (Cytop, manufactured by Asahi Glass Company, Limited) formed on one side of said resin film and an acrylic type adhesive layer formed on the other surface of the resin film (hereinafter referred to as "low-reflecting resin film") was prepared.

Figure 22:
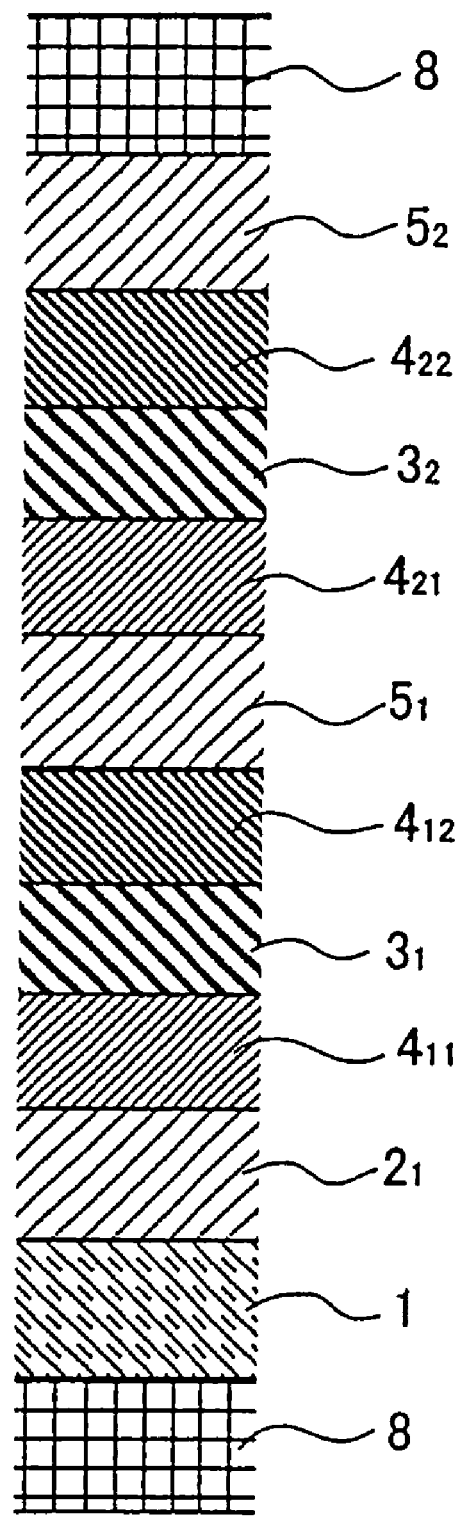
FIG. 22 is a diagrammatical cross-sectional view illustrating a layer constitution of laminates produced in Examples 41 to 42.

Then, as illustrated in FIG. 22, the low-reflecting resin film 8 was attached on the titania layer 52 of the laminate A-38 obtained in Example 38 and on the surface of the soda lime glass on the side opposite to the side on which the laminate layers were laminated, to produce a laminate A-41.

Of the obtained laminate A-41, the visible light transmittance, the visible light reflectance, the transmittance of light having a wavelength of 900 nm and the sheet resistance value were measured in the same manner as in Example 38. The results are shown in Table 5.

Example 42

In the acrylic type adhesive layer of the low-reflecting resin film used in Example 41, a near-infrared absorbent (SIR 159, manufactured by Mitsui Chemicals Inc.) was added in an amount of 5 wt % based on the acrylic type adhesive, to prepare a resin film having a near-infrared shielding property imparted together with a low-reflecting property (hereinafter referred to as "low-reflecting near-infrared shielding resin film").

Then, in the same manner as in Example 41, the low-reflecting near-infrared shielding resin film was attached on the titania layer 52 of the laminate A-38 obtained in Example 38 and on the surface of the soda lime glass on the side opposite to the side on which the laminated layers were laminated to produce a laminate A-42. The obtained laminate A-42 was measured in the same manner as in Example 38. The results are shown in Table 5.

It is found from the results as shown in Table 5 that by attaching low-reflecting resin films, the visible light reflectance can be suppressed to be less than 2% while obtaining a visible light transmittance of at least 74%, and a better low-reflecting property than the laminate A-38 can be obtained. Further, it is found that by attaching low-reflecting near-infrared shielding resin films, the transmittance of light having a wavelength of 900 nm can be suppressed to be at most 5% substantially without impairing good optical characteristics at the visible light region, and a still better near-infrared shielding property than the laminate A-38 can be obtained.

Further, with respect to the laminates A-24, 25, 28, 29, 32 and 33 and the laminate B-6, the abrasion resistance was evaluated and the results are shown in Table 6.

It is found from the results as shown in Table 6 that the laminate having a plurality of Ag-1 at % Pd layers wherein an interlayer is formed on the outermost Ag-1 at % Pd layer a greater effect to improve the abrasion resistance as compared with a case where an interlayer is laminated on the lower Ag-1 at % Pd layer. Further, it is preferred to form an interlayer on each of the plurality of the Ag-1 at % Pd layers.

EXAMPLE 43

Figure 23:
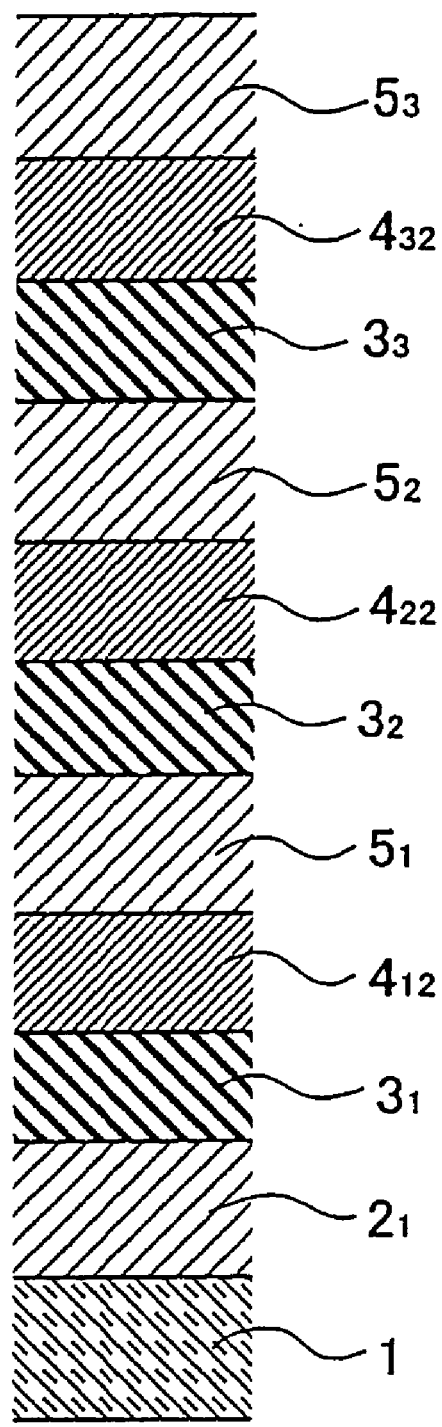
FIG. 23 is a diagrammatical cross-sectional view illustrating a layer constitution of a laminate produced in Example 43.

A laminate A-43 having a layer constitution as illustrated in FIG. 23, each layer having a constitution as identified in Table 7, was produced.

Of the obtained laminate A-43, the visible light transmittance, the visible light reflectance and the sheet resistance value are shown in Table 7.

Comparative Example 7

Figure 24:
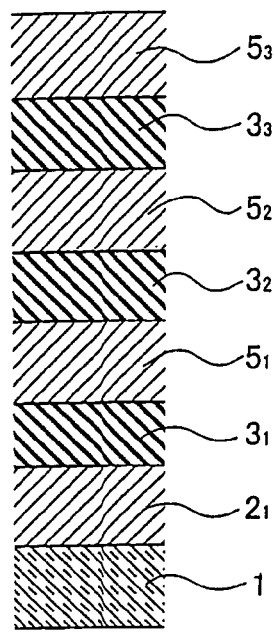
FIG. 24 is a diagrammatical cross-sectional view illustrating a layer constitution of a laminate produced in Comparative Example 7.

A laminate B-7 having a layer constitution as illustrated in FIG. 24, each layer having a constitution as identified in Table 7, was produced in the same manner as in Example 43 except that no interlayer was formed.

Of the obtained laminate B-7, the visible light transmittance, the visible light reflectance and the sheet resistance value are shown in Table 7.

Examples 44 and 45

Figure 25:
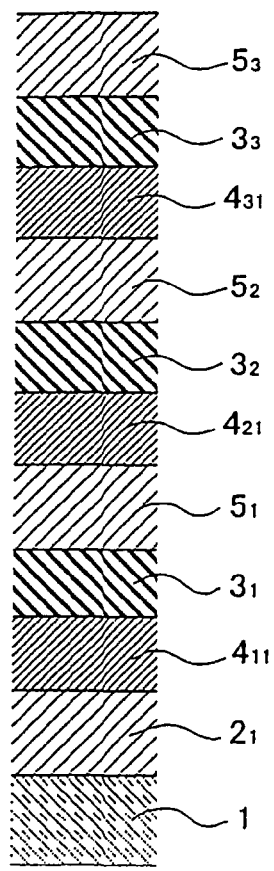
FIG. 25 is a diagrammatical cross-sectional view illustrating a layer constitution of a laminate produced in Example 44.
Figure 26:
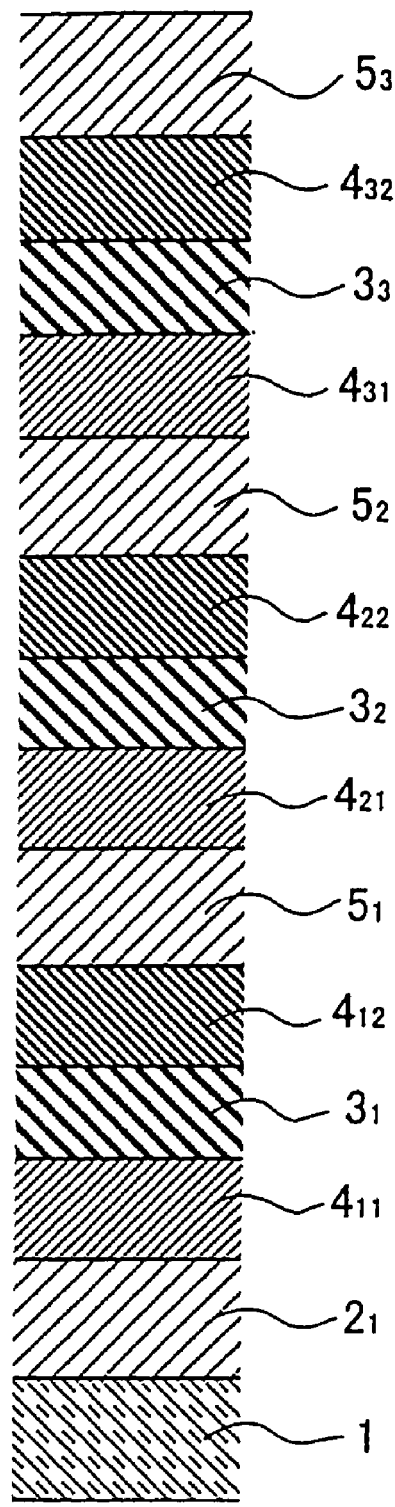
FIG. 26 is a diagrammatical cross-sectional view illustrating a layer constitution of a laminate produced in Example 45.

Laminates A-44 and 45 having layer constitutions as illustrated in FIG. 25 (Example 44) and FIG. 26 (Example 45), respectively, each layer having a constitution as identified in Table 7, were produced in the manner as in Example 43.

Of the obtained laminates A-44 and 45, the visible light transmittance, the visible light reflectance and the sheet resistance value were measured, and the results are shown in Table 7 together with the results in Example 43.

It is found from the results as shown in Table 7 that preferred is a laminate having a $SiN_x$ interlayer formed on and below the Ag-1 at % Pd layers and wherein the (2n+1) layers are seven layers, in order to obtain a laminate having a sheet resistance value of 1.5 $\Omega/\square$ and a visible light transmittance of at least 67%.

Further, with respect to the laminate A-45, the transmittance of light having a wavelength of 900 nm and the electromagnetic wave shield factor at a frequency of 30 MHz were measured, and they were 2.4% and 17 dB, respectively, and the laminate was found to have good near-infrared shielding property and electromagnetic wave shielding property.

Example 46

Figure 27:
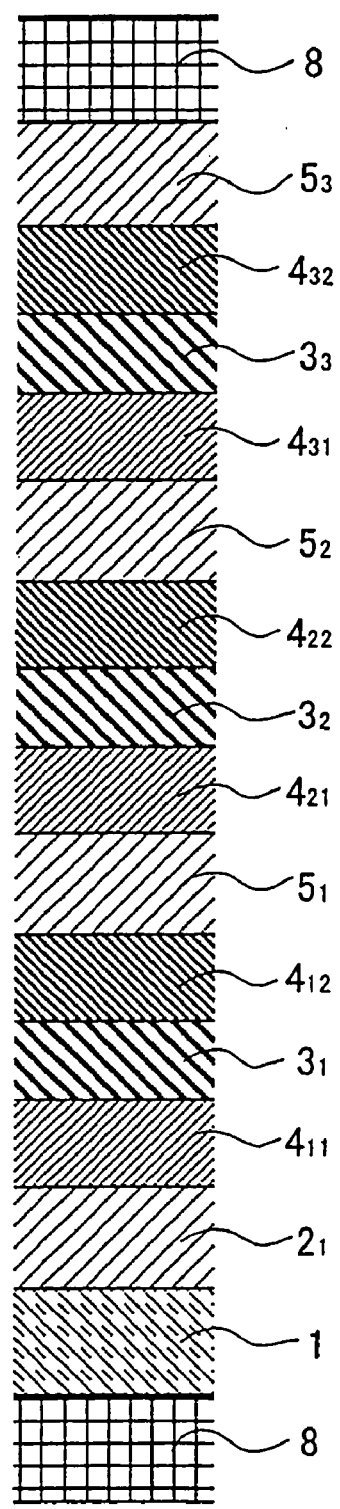
FIG. 27 is a diagrammatical cross-sectional view illustrating a layer constitution of laminates produced in Examples 46 to 47.

A laminate A-46 was produced by attaching a low-reflecting resin film 8 on the titania layer 53 of the laminate A-45 obtained in Example 45 and on the surface of the soda lime glass on the side opposite to the side on which the laminated layers were laminated, as illustrated in FIG. 27.

Of the obtained laminate A-46, the visible light transmittance, the visible light reflectance, the sheet resistance value and the transmittance of light having a wavelength of 900 nm are shown in Table 8.

Example 47

A laminate A-47 was produced in the same manner as in Example 46 by attaching a low-reflecting near-infrared shielding resin film on the titania layer $5_3$ of the laminate A-45 obtained in Example 45 and on the surface of the soda lime glass on the side opposite to the side on which the laminated layers were laminated. With respect to the obtained laminate A-47, measurement was carried out in the same manner as in Example 46. The results are shown in Table 8.

As shown in Table 8, it is found that by attaching low-reflecting resin films, the visible light reflectance can be suppressed to be less than 2% while obtaining a visible light transmittance of at least 67%, and a still better low-reflecting property than the laminate A-45 can be obtained. Further, it is found that by attaching low-reflecting near-infrared shielding resin films, a still better near-infrared shielding property than the laminate A-45 can be obtained substantially without impairing good optical characteristics at the visible light region.

Example 48

Figure 28:
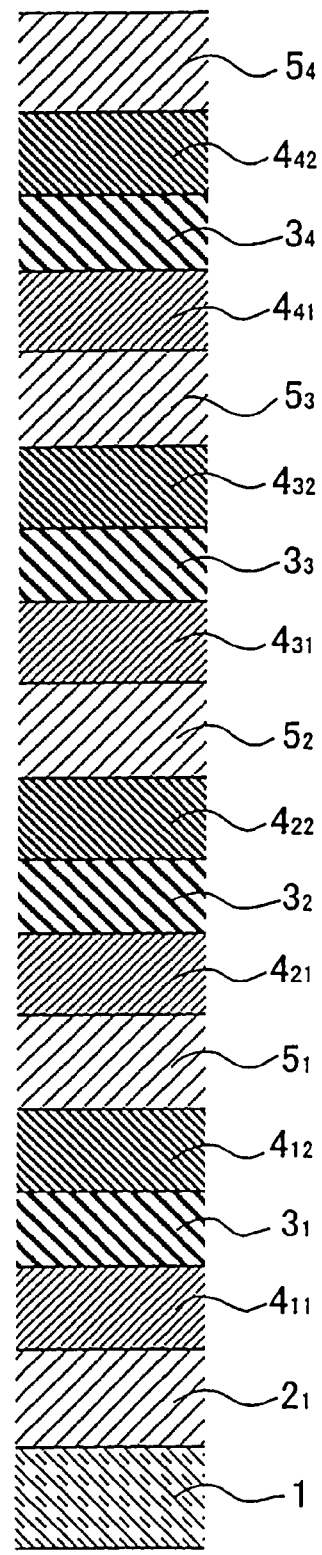
FIG. 28 is a diagrammatical cross-sectional view illustrating a layer constitution of laminates produced in Examples 48 to 54.

A laminate A-48 having a layer constitution as illustrated in FIG. 28, each layer having a constitution as identified in Table 9, was produced.

Of the obtained laminate A-48, the visible light transmittance, the visible light reflectance and the sheet resistance value are shown in Table 9.

Comparative Example 9

Figure 29:
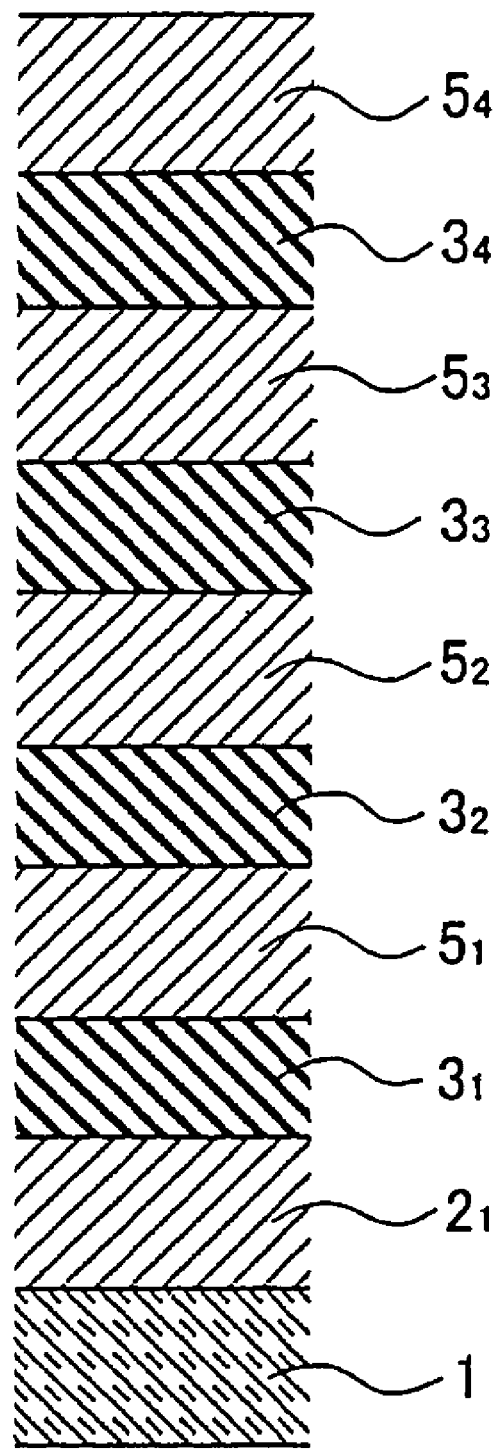
FIG. 29 is a diagrammatical cross-sectional view illustrating a layer constitution of a laminate produced in Comparative Example 9.

A laminate B-9 having a layer constitution as illustrated in FIG. 29, each layer having a constitution as identified in Table 9, was produced in the same manner as in Example 48 except that no interlayer was formed.

Of the obtained laminate B-9, the visible light transmittance, the visible light reflectance and the sheet resistance value are shown in Table 9.

Examples 49 to 54 and Comparative Examples 10 and 11

Laminates A-49 to A-54 were produced in the same manner as in Example 48 except that the thickness of the titania layer, the $SiN_x$ interlayer or the Ag-1 at % Pd layer was changed as identified in Table 9. Further, laminates B-10 and B-11 were produced in the same manner as in Comparative Example 9 except that the thickness of the titania layer or the Ag-1 at % Pd layer was changed as identified in Table 9.

Of the obtained laminates A-49 to A-54 and the laminates B-10 and B-11, the visible light transmittance, the visible light reflectance and the sheet resistance value are shown in Table 9.

The laminates having a constitution wherein the $SiN_x$ interlayer is formed on and below the Ag-1 at % Pd layers show a high visible light transmittance and show a transmittance higher by about 15% than the laminates having no interlayer of Comparative Examples 9 to 11. Further, the effect can be obtained with a film thickness of the $SiN_x$ interlayer of 1 nm, and the effect does not depend on the film thickness of the $SiN_x$ interlayer.

Figure 30:
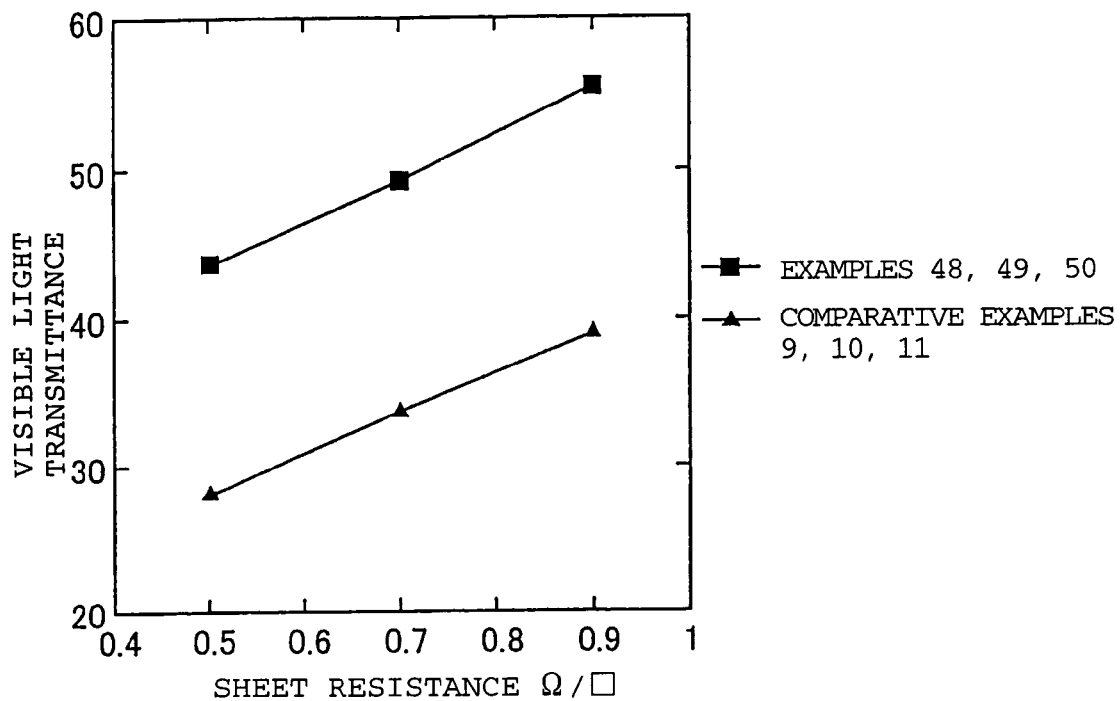
FIG. 30 is a diagram illustrating the relation between sheet resistance values and visible light transmittances of laminates produced in Examples 48 to 50 and Comparative Examples 9 to 11.
Figure 31:
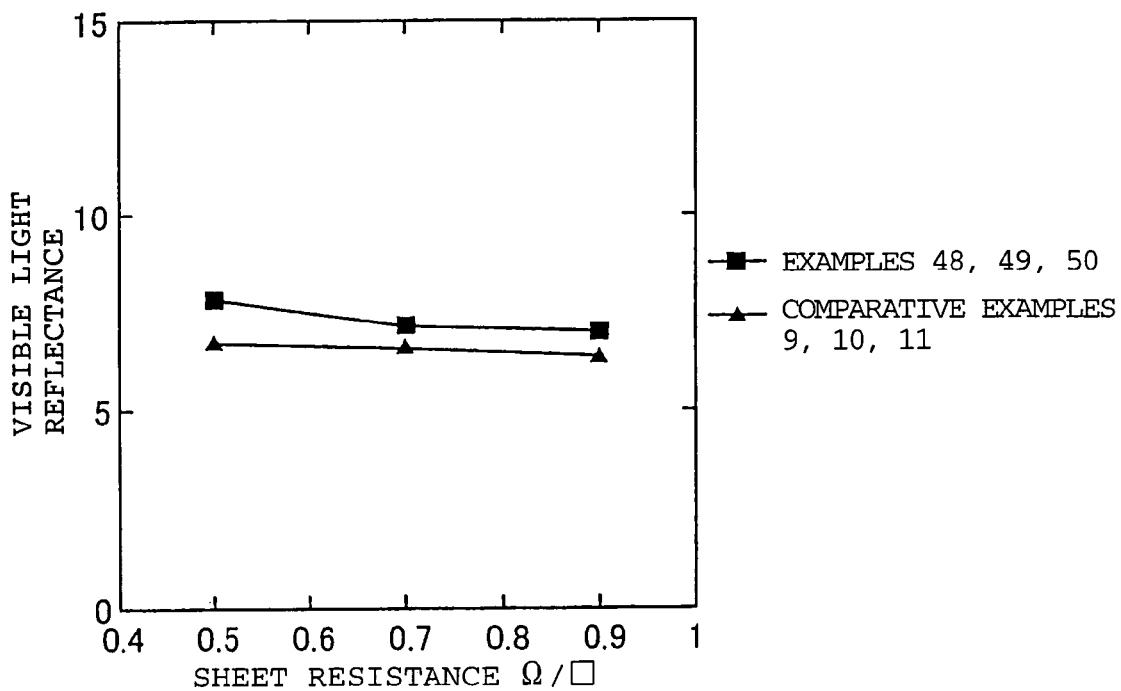
FIG. 31 is a diagram illustrating the relation between sheet resistance values and visible light reflectances of laminates produced in Examples 48 to 50 and Comparative Examples 9 to 11.

With respect to Examples 48 to 50 and Comparative Examples 9 to 11, the relation between the visible light transmittance and the sheet resistance value is shown in FIG. 30, and the relation between the visible light reflectance and the sheet resistance value is shown in FIG. 31.

It is found from the results shown in FIGS. 30 and 31 that preferred is a laminate having a $SiN_x$ interlayer formed on and below the Ag-1 at % Pd layers and wherein the (2n+1) layers are nine layers as in Examples 48 to 50, in order to obtain a laminate having a visible light transmittance of at least 40% and a visible light reflectance of at most 10% together with a low sheet resistance value of from 0.5 to 0.9 $\Omega/\square$. Here, the electromagnetic wave shield factor showed a value exceeding 17 db (about 20 db or above) in each Example.

Example 55

Figure 32:
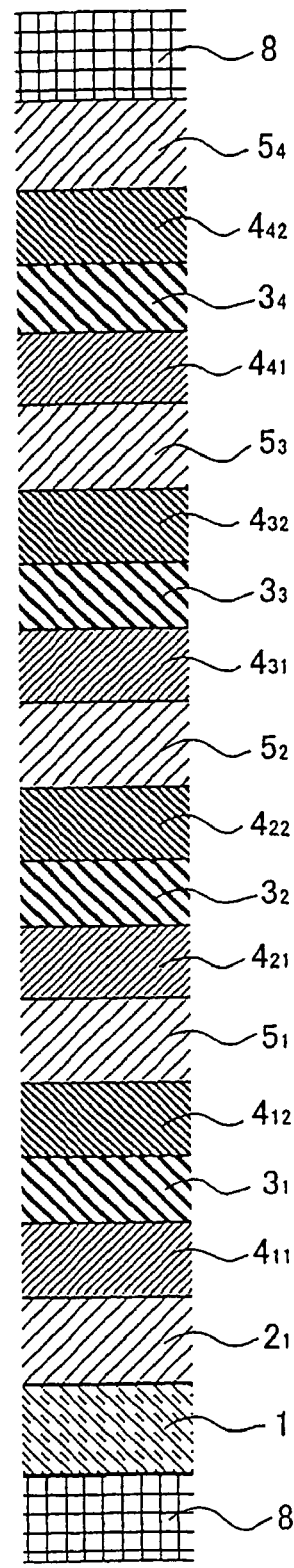
FIG. 32 is a diagrammatical cross-sectional view illustrating a layer constitution of laminates produced in Examples 55 to 57.

A laminate A-55 was produced by attaching a low-reflecting resin film 8 on the titania layer $5_4$ of the laminate A-48 obtained in Example 48 and on the surface of the soda lime glass on the side opposite to the side L95, on which the laminated layers were laminated, as illustrated in FIG. 32.

Of the obtained laminate A-55, the visible light transmittance and the visible light reflectance are shown in Table 10.

Examples 56 and 57

Laminates A-56 and 57 were produced in the same manner as in Example 55 by attaching a low-reflecting resin film 8 on the titania layer $5_4$ of the laminates A-49 and 50 obtained in Examples 49 and 50 and on the surface of the soda lime glass on the side opposite to the side on which the laminated layers were laminated.

Comparative Examples 12 to 14

Laminates B-12 to 14 were produced in the same manner as in Example 55 by attaching a low-reflecting resin film on the titania layer $5_4$ of the laminates B-9 to 11 of Comparative Examples 9 to 11 and on the surface of the soda lime glass on the side opposite to the side on which the laminated layers were laminated.

Of the obtained laminates A-55 to A-57 and laminates B-12 to B-14, the visible light transmittance, the visible light reflectance and the sheet resistance value are shown in Table 10. Here, the sheet resistance value was measured before the attachment of the low-reflecting resin films.

Figure 33:
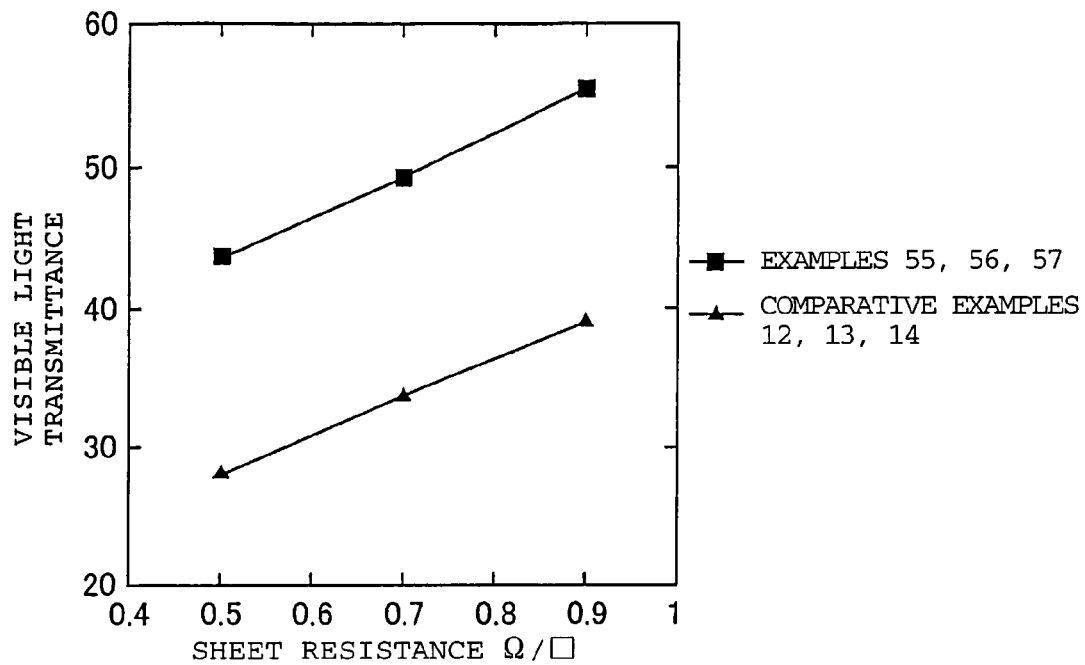
FIG. 33 is a diagram illustrating the relation between sheet resistance values and visible light transmittances of laminates produced in Examples 55 to 57 and Comparative Examples 12 to 14.
Figure 34:
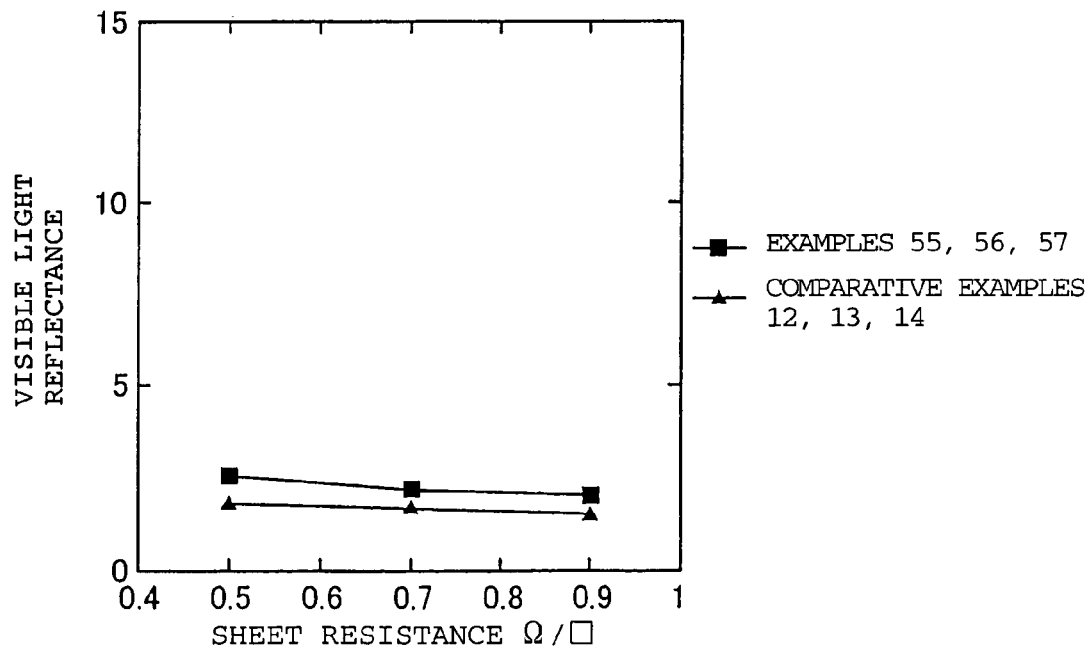
FIG. 34 is a diagram illustrating the relation between sheet resistance values and visible light reflectances of laminates produced in Examples 55 to 57 and Comparative Examples 12 to 14.

With respect to Examples 55 to 57 and Comparative Examples 12 to 14, the relation between the visible light transmittance and the sheet resistance value is shown in FIG. 33, and the relation between the visible light reflectance and the sheet resistance value is shown in FIG. 34. It is found from the results shown in FIGS. 33 and 34 that a layer constitution wherein four layers each of the Ag-1 at % Pd layers and the titanium oxide layers were alternately laminated with the $SiN_x$ interlayer interposed therebetween and the low-reflecting resin film was attached on the titania layer 54 and on the soda lime glass substrate, is preferred in order to obtain a laminate having a visible light transmittance of at least 40% and a visible light reflectance of at most 3% together with a low sheet resistance value of from 0.5 to 0.9 $\Omega/\square$.

Examples 58 to 62

Laminates A-58 to A-62 were produced in the same manner as in Examples 13 to 17 except that formation of each titania layer was carried out by using a Ti target (area: 432 mm×127 mm) with an application electric power of 4 kW by using argon gas containing 50 vol % of oxygen gas as a sputtering gas, and the thickness of the $SiN_x$ interlayer was from 1.0 to 3.0 nm.

Comparative Example 15

A laminate B-15 was produced in the same manner as in Comparative Example 1 except that formation of the titania layer was carried out by using a Ti target (area: 432 mm×127 mm) with an application electric power of 4 kW by using argon gas containing 50 vol % of oxygen gas as a sputtering gas.

Comparative Example 16

A laminate B-16 was produced in the same manner as in Comparative Example 15 except that after the Ag-1 at % Pd layer was formed, a Ti layer of 1.5 nm was formed by using a Ti target (area: 432 mm×127 mm) with an application electric power of 1 kW by using argon gas as a sputtering gas.

Of the laminates A-58 and 62 and the laminates B-15 to 16 obtained in Examples 58 to 62 and Comparative Examples 15 to 16, the visible light transmittance, the visible light reflectance, the sheet resistance value and the emissivity were measured. The results of Examples 58 to 62 are shown in Table 11, and the results of Comparative Examples 15 to 16 are shown in Table 12.

In a case of forming a titania layer by conventional reactive sputtering by using a Ti target, it is necessary to carry out film formation by using a sputtering gas containing an oxidizing gas in a large amount. In this case, oxygen negative ions are formed in a large amount due to impact of the oxidizing gas and electron, and the generation probability reaches from 20 to 30% in a case of impact on electron having a kinetic energy of several tens eV. The oxygen negative ions thus formed in a large amount are accelerated in the substrate direction by an electric field in the vicinity of the target charged negatively. The accelerated oxygen negative ions have a kinetic energy at a level of from 100 to 200 eV in the vicinity of the substrate, and are impacted in the Ag-1 at % Pd layer which is a layer under the titania layer in a depth at a level of 1.5 nm on the average to oxidize the metals. Due to this oxidization, the sheet resistance value and the emissivity tend to increase, whereby an electrically conductive laminate (low-emissive laminate) tends to hardly be obtained.

With respect to the laminate B-15 obtained in Comparative Example 15, the metals in the Ag-1 at % Pd layer were oxidized in process of forming the titania layer, whereby the resistance value and the emissivity increased, and no electrical conductivity and low-emissivity were obtained.

The laminate B-16 obtained in Comparative Example 16 has a constitution wherein a titania layer was laminated on the Ag-1 at % Pd layer with a Ti layer interposed therebetween. Oxidation of the Ag-1 at % Pd layer under the titania layer, due to impact of the oxygen negative ions in process of forming the titania layer, was prevented by providing a Ti layer.

In a case where the thickness of the Ti layer is at a level of 1.5 nm, substantially all the Ti layer after formation of the titania layer is oxidized to form a titania layer. Accordingly, the laminate B-16 obtained finally has substantially the same layer constitution as the laminate B-1 having no interlayer obtained in Comparative Example 1.

It is found from the results shown in Tables 11 and 12 that with respect to the laminate having a titania layer formed by a conventional reactive sputtering method by using a Ti target also, by interposing the $SiN_x$ interlayer in an appropriate thickness (at least 2 nm) between the Ag-1 at % Pd layer and the titania layer, a high visible light transmittance can be obtained as compared with the laminate B-16 having substantially no interlayer obtained in Comparative Example 16.

Example 63

A laminate A-63 was obtained in the same manner as in Example 1 except that formation of the interlayer was changed as follows.

Namely, on the Ag-1 at % Pd layer, an interlayer consisting of ZnO containing 5.7 wt % of $Ga_2O_3$ (hereinafter referred to simply as "GZO interlayer") (refractive index: 2.0, thickness: 0.5 nm) was formed by using a target (area: 432 mm×127 mm) consisting of ZnO containing 5.7 wt % of $Ga_2O_3$ as calculated as $Ga_2O_3/(Ga_2O_3+ZnO)$, by using argon gas as a sputtering gas with an application electric power of 1 kW.

The obtained laminate A-63 had a constitution wherein on a soda lime glass 1, a titania layer $2_1$, a Ag-1 at % Pd layer 31, a GZO interlayer $4_{12}$ and a titania layer $5_1$ sequentially laminated, as illustrated in FIG. 1. The thickness of each layer is shown in Table 13.

Examples 64 to 80

Laminates A-64 to A-80 were produced in the same manner as in Example 63 except that the thickness or the position of the GZO interlayer was changed as identified in Table 13.

Of these laminates, the visible light transmittance, the visible light reflectance, the sheet resistance value and the emissivity were measured. The results are shown in Table 13.

Among the laminates having the GZO interlayer, one having an interlayer on and below the Ag-1 at % Pd layer disposed shows the highest visible light transmittance, and shows a visible light transmittance higher by about 3% as compared with the case of interposing no interlayer of Comparative Example 1. The effect can be obtained with a film thickness of the GZO interlayer of 0.5 nm, and the effect does not depend on the film thickness.

Examples 81 to 100

Laminates A-81 to A-100 were produced in the same manner as in Example 63 except that the thickness and the position of the GZO interlayer were changed as identified in Table 14, and the abrasion resistance was evaluated. The results are shown in Table 14 together with the results of Comparative Example 1.

It is found from the results shown in Table 14 that the laminate having a layer constitution wherein a GZO interlayer in a thickness of at least 1 nm was formed on or below the Ag-1 at % Pd layer, has an improved pencil scratch value as an index of the abrasion resistance. Further, it is found that the laminates having a layer constitution wherein an interlayer was formed on the Ag-1 at % Pd layer has a greater effect of improving the pencil scratch value, and that the pencil scratch value is further improved by increasing the thickness of the interlayer.

Example 101

A laminate A-101 with a constitution having two Ag-1 at % Pd layers was produced in the same manner as in Example 22 except that the interlayer was changed into a GZO interlayer, by sequentially forming a titania layer of 33 nm, a GZO interlayer of 1 nm, a Ag-1 at % Pd layer of 14 nm, a titania layer of 66 nm, a Ag-1 at % Pd layer of 14 nm and a titania layer of 33 nm in this order on a soda lime glass.

Examples 102 to 121

Laminates A-102 to A-121 were produced in the same manner as in Example 101 except that the thickness of the GZO interlayer or the position of the formation of the interlayer was changed, as identified in Table 15.

Of the obtained laminates A-101 to A-121, the visible light transmittance, the visible light reflectance, the sheet resistance value and the emissivity were measured. The results are shown in Table 15.

Among laminates having the GZO interlayer and having two Ag-1 at % Pd layers, a constitution wherein the GZO interlayer was disposed on and below both the first and second Ag-1 at % Pd layers shows the highest visible light transmittance, and shows a visible light transmittance higher by about 7% as compared with the case of interposing no interlayer of Comparative Example 6. The effect can be obtained with a film thickness of the GZO interlayer of 0.5 nm, and does not depend on the film thickness.

Example 122

A laminate A-122 was obtained in the same manner as in Example 6 except that the interlayer was changed into the following layer consisting of $NbO_x$.

Namely, an interlayer consisting of $NbO_x$ (x=2.5) (refractive index: 2.35, thickness: 0.5 nm) was formed by using a target (area: 432 mm×127 mm) consisting of $NbO_x$ (x=2.49), by using argon gas containing 10 vol % of oxygen as a sputtering gas with an application electric power of 1 kW.

The obtained laminate A-122 has a constitution wherein on a soda lime glass 1, a titania layer, an interlayer consisting of $NbO_x$ (hereinafter referred to as "$NbO_x$ interlayer"), a Ag-1 at % Pd layer and a titania layer were sequentially laminated.

Examples 123 to 126

Laminates A-123 to A-126 were produced in the same manner as in Example 122 except that the thickness of the $NbO_x$ interlayer was changed within a range of from 1 to 4 nm as identified in Table 16.

Of the obtained laminates A-122 to A-126, the visible light transmittance, the visible light reflectance, the sheet resistance value and the emissivity were measured. The results are shown in Table 16.

The laminate having the $NbO_x$ interlayer below the Ag-1 at % Pd layer shows a visible light transmittance higher by about 1.5% as compared with Comparative Example 1 with no interlayer. Further, the effect can be obtained with a film thickness of the $NbO_x$ interlayer of 0.5 nm, and the effect does not depend on the film thickness.

Example 127

A laminate A-127 was obtained in the same manner as in Example 6 except that the interlayer was changed into the following layer consisting of $SnO_2$ containing indium.

An interlayer consisting of $SnO_2$ containing 10 wt % of indium (hereinafter referred to as "ITO interlayer") (refractive index: 2.0, thickness: 1 nm) was formed by using a target (area: 432 mm×127 mm) consisting of $SnO_2$ containing 10 wt % of indium, by using argon gas as a sputtering gas with an application electric power of 1 kW.

Examples 128 to 131

Laminates A-128 to A-131 were produced in the same manner as in Example 127 except that the thickness of the ITO interlayer was changed within a range of from 1.5 to 4 nm as identified in Table 17.

Of the laminates A-127 to A-131, the visible light transmittance, the visible light reflectance, the sheet resistance value and the emissivity were measured. The results are shown in Table 17.

The laminates having the ITO interlayer below the Ag-1 at % Pd layer shows a visible light transmittance higher by about 1.5% as compared with the laminate having no interlayer interposed of Comparative Example 1. The effect can be obtained with a film thickness of the ITO interlayer of 1 nm, and the effect does not depend on the film thickness.

INDUSTRIAL APPLICABILITY

According to the present invention, a laminate by using a titanium oxide, having an improved transmittance as the visible light region, can be obtained.

Further, according to the present invention, a laminate by using a titanium oxide, having an improved abrasion resistance, can be obtained.

TABLE 1

(unit of layer thickness: nm)

| | Comp. Ex. | Examples | | | | | | | | | |
|---|---|---|---|---|---|---|---|---|---|---|---|
| | 1 | 1 | 2 | 3 | 4 | 5 | 6 | 7 | 8 | 9 | 10 |
| 7. Top coat ($SiN_x$) | — | — | — | — | — | — | — | — | — | — | — |
| 6. Titania layer | 33 | 33 | 33 | 33 | 33 | 33 | 33 | 33 | 33 | 33 | 33 |
| 5. $SiN_x$ interlayer | — | 0.5 | 1 | 2 | 3 | 5 | — | — | — | — | — |
| 4. Ag-1 at % Pd layer | 14 | 14 | 14 | 14 | 14 | 14 | 14 | 14 | 14 | 14 | 14 |
| 3. $SiN_x$ interlayer | — | — | — | — | — | — | 0.5 | 0.8 | 1 | 1.5 | 2 |
| 2. Titania layer | 33 | 33 | 33 | 33 | 33 | 33 | 33 | 33 | 33 | 33 | 33 |

TABLE 1-continued (unit of layer thickness: nm)

| | Comp. Ex. 1 | Examples 1 | 2 | 3 | 4 | 5 | 6 | 7 | 8 | 9 | 10 |
|---|---|---|---|---|---|---|---|---|---|---|---|
| 1. Bottom coat ($SiN_x$) | — | — | — | — | — | — | — | — | — | — | — |
| Visible light transmittance (%) | 81.4 | 83.2 | 83 | 83.3 | 83.4 | 83.3 | 83.3 | 83.3 | 83.2 | 83.3 | 83.2 |
| Visible light reflectance (%) | 5.0 | 4.8 | 4.7 | 4.8 | 4.9 | 4.7 | 4.7 | 4.8 | 4.8 | 4.7 | 4.7 |
| Sheet resistance value (Ω/□) | 5.0 | 5.0 | 5.0 | 4.9 | 4.9 | 4.9 | 5.0 | 5.0 | 5.0 | 5.0 | 5.0 |
| Emissivity | 0.06 | 0.06 | 0.05 | 0.05 | 0.05 | 0.05 | 0.06 | 0.06 | 0.05 | 0.05 | 0.05 |

TABLE 2

(unit of layer thickness: nm)

| | Examples | | | | | | | Comp. Ex. | | | |
|---|---|---|---|---|---|---|---|---|---|---|---|
| | 11 | 12 | 13 | 14 | 15 | 16 | 17 | 2 | 3 | 4 | 5 |
| 7. Top coat ($SiN_x$) | — | — | — | — | — | — | — | 1 | 5 | — | — |
| 6. Titania layer | 33 | 33 | 33 | 33 | 33 | 33 | 33 | 33 | 33 | 33 | 33 |
| 5. $SiN_x$ interlayer | — | — | 0.5 | 1 | 2 | 3 | 5 | — | — | — | — |
| 4. Ag-1 at % Pd layer | 14 | 14 | 14 | 14 | 14 | 14 | 14 | 14 | 14 | 14 | 14 |
| 3. $SiN_x$ interlayer | 3 | 5 | 0.5 | 1 | 2 | 3 | 5 | — | — | — | — |
| 2. Titania layer | 33 | 33 | 33 | 33 | 33 | 33 | 33 | 33 | 33 | 33 | 33 |
| 1. Bottom coat ($SiN_x$) | — | — | — | — | — | — | — | — | — | 1 | 5 |
| Visible light transmittance (%) | 83.4 | 83.3 | 84.5 | 84.5 | 84.6 | 84.4 | 84.7 | 82 | 81.8 | 81.8 | 82 |
| Visible light reflectance (%) | 4.6 | 4.6 | 4.6 | 4.5 | 4.6 | 4.7 | 4.6 | 4.8 | 4.9 | 4.7 | 4.7 |
| Sheet resistance value (Ω/□) | 5.0 | 5.0 | 5.0 | 5.0 | 4.9 | 5.0 | 4.9 | 5.0 | 5.0 | 5.0 | 5.0 |
| Emissivity | 0.05 | 0.05 | 0.06 | 0.05 | 0.05 | 0.05 | 0.05 | 0.06 | 0.06 | 0.06 | 0.06 |

TABLE 3

(unit of layer thickness: nm)

| | Examples | | | | | | | | | | | Comp. Ex. |
|---|---|---|---|---|---|---|---|---|---|---|---|---|
| | 1 | 2 | 4 | 5 | 18 | 19 | 8 | 11 | 12 | 20 | 21 | 1 |
| 5. Titania layer | 33 | 33 | 33 | 33 | 33 | 33 | 33 | 33 | 33 | 33 | 33 | 33 |
| 4. $SiN_2$ | 0.5 | 1 | 3 | 5 | 8 | 10 | — | — | — | — | — | — |
| 3. Ag-1 at % Pd layer | 14 | 14 | 14 | 14 | 14 | 14 | 14 | 14 | 14 | 14 | 14 | 14 |
| 2. $SiN_2$ | — | — | — | — | — | — | 1 | 3 | 5 | 8 | 10 | — |
| 1. Titania layer | 33 | 33 | 33 | 33 | 33 | 33 | 33 | 33 | 33 | 33 | 33 | 33 |
| Pencil scratch value | 3 H | 4 H | 6 H | 6 H | 7 H | 7 H | H | H | H | H | H | B |
| Laminate | A-1 | A-2 | A-4 | A-5 | A-18 | A-19 | A-8 | A-11 | A-12 | A-20 | A-21 | B-1 |

TABLE 4

(unit of layer thickness: nm)

| | Comp. Ex. 6 | Examples 22 | 23 | 24 | 25 | 26 | 27 | 28 | 29 | 30 |
|---|---|---|---|---|---|---|---|---|---|---|
| 11. Top coat ($SiN_x$) | — | — | — | — | — | — | — | — | — | — |
| 10. Titania layer | 33 | 33 | 33 | 33 | 33 | 33 | 33 | 33 | 33 | 33 |
| 9. $SiN_x$ interlayer | — | — | — | — | — | — | — | 1 | 5 | — |
| 8. Ag-1 at % Pd layer | 14 | 14 | 14 | 14 | 14 | 14 | 14 | 14 | 14 | 14 |
| 7. $SiN_x$ interlayer | — | — | — | — | — | 1 | 5 | — | — | 1 |
| 6. Titania layer | 66 | 66 | 66 | 66 | 66 | 66 | 66 | 66 | 66 | 66 |
| 5. $SiN_x$ interlayer | — | — | — | 1 | 5 | — | — | — | — | — |
| 4. Ag-1 at % Pd layer | 14 | 14 | 14 | 14 | 14 | 14 | 14 | 14 | 14 | 14 |
| 3. $SiN_x$ interlayer | — | 1 | 5 | — | — | — | — | — | — | 1 |
| 2. Titania layer | 33 | 33 | 33 | 33 | 33 | 33 | 33 | 33 | 33 | 33 |
| 1. Bottom coat ($SiN_x$) | — | — | — | — | — | — | — | — | — | — |
| Visible light transmittance (%) | 68 | 69.4 | 69.3 | 69.6 | 70.2 | 70.1 | 70.3 | 70.3 | 70.4 | 71.4 |
| Visible light reflectance (%) | 6.2 | 6.2 | 6.1 | 6.1 | 6.2 | 6.2 | 6.3 | 6.2 | 6.3 | 6.2 |
| Sheet resistance value (Ω/□) | 2.5 | 2.5 | 2.5 | 2.5 | 2.5 | | | | | |
| Emissivity | 0.04 | 0.03 | 0.03 | 0.03 | 0.03 | | | | | |

TABLE 4-continued

| | | | | | |
|---|---|---|---|---|---|
| Sheet resistance value (Ω/□) | 2.5 | 2.5 | 2.5 | 2.5 | 2.5 |
| Emissivity | 0.03 | 0.03 | 0.03 | 0.03 | 0.03 |

(unit of layer thickness: nm)

| | Examples | | | | |
|---|---|---|---|---|---|
| | 31 | 32 | 33 | 34 | 35 |
| 11. Top coat (SiN$_x$) | — | — | — | — | — |
| 10. Titania layer | 33 | 33 | 33 | 33 | 33 |
| 9. SiN$_x$ interlayer | — | 1 | 5 | — | — |
| 8. Ag-1 at % Pd layer | 14 | 14 | 14 | 14 | 14 |
| 7. SiN$_x$ interlayer | 5 | — | — | — | — |
| 6. Titania layer | 66 | 66 | 66 | 66 | 66 |
| 5. SiN$_x$ interlayer | — | 1 | 5 | 1 | 5 |
| 4. Ag-1 at % Pd layer | 14 | 14 | 14 | 14 | 14 |
| 3. SiN$_x$ interlayer | 5 | — | — | 1 | 5 |
| 2. Titania layer | 33 | 33 | 33 | 33 | 33 |
| 1. Bottom coat (SiN$_x$) | — | — | — | — | — |
| Visible light transmittance (%) | 71.8 | 71.2 | 71.4 | 71.0 | 71.3 |
| Visible light reflectance (%) | 6.3 | 6.2 | 6.2 | 6.1 | 6.3 |
| Sheet resistance value (Ω/□) | 2.5 | 2.5 | 2.5 | 2.5 | 2.5 |
| Emissivity | 0.03 | 0.03 | 0.03 | 0.03 | 0.03 |

(unit of layer thickness: nm)

| | Examples | | | | |
|---|---|---|---|---|---|
| | 36 | 37 | 38 | 39 | 40 |
| 11. Top coat (SiN$_x$) | — | — | — | — | — |
| 10. Titania layer | 33 | 33 | 33 | 33 | 33 |
| 9. SiN$_x$ interlayer | 1 | 5 | 1 | 3 | 5 |
| 8. Ag-1 at % Pd layer | 14 | 14 | 14 | 14 | 14 |
| 7. SiN$_x$ interlayer | 1 | 5 | 1 | 3 | 5 |
| 6. Titania layer | 66 | 66 | 66 | 66 | 66 |
| 5. SiN$_x$ interlayer | — | — | 1 | 3 | 5 |
| 4. Ag-1 at % Pd layer | 14 | 14 | 14 | 14 | 14 |
| 3. SiN$_x$ interlayer | — | — | 1 | 3 | 5 |
| 2. Titania layer | 33 | 33 | 33 | 33 | 33 |
| 1. Bottom coat (SiN$_x$) | — | — | — | — | — |
| Visible light transmittance (%) | 71.5 | 72.5 | 74.3 | 74.3 | 74.5 |
| Visible light reflectance (%) | 6.3 | 6.3 | 6.3 | 6.4 | 6.5 |
| Sheet resistance value (Ω/□) | 2.5 | 2.5 | 2.5 | 2.5 | 2.5 |
| Emissivity | 0.03 | 0.03 | 0.03 | 0.03 | 0.03 |

(unit of layer thickness: nm)

| | Examples | | | Comp. Ex. |
|---|---|---|---|---|
| | 38a | 39a | 40a | 6a |
| 11. Top coat (SiN$_x$) | — | — | — | — |
| 10. Titania layer | 33 | 33 | 33 | 33 |
| 9. SiN$_x$ interlayer | 1 | 3 | 5 | — |
| 8. Ag-1 at % Pd-1 at % Cu layer | 14 | 14 | 14 | 14 |
| 7. SiN$_x$ interlayer | 1 | 3 | 5 | — |
| 6. Titania layer | 66 | 66 | 66 | 66 |
| 5. SiN$_x$ interlayer | 1 | 3 | 5 | — |
| 4. Ag-1 at % Pd-1 at % Cu layer | 14 | 14 | 14 | 14 |
| 3. SiN$_x$ interlayer | 1 | 3 | 5 | — |
| 2. Titania layer | 33 | 33 | 33 | 33 |
| 1. Bottom coat (SiN$_x$) | — | — | — | — |
| Visible light transmittance (%) | 74.1 | 74.0 | 74.0 | 67.8 |
| Visible light reflectance (%) | 6.3 | 6.2 | 6.3 | 6.2 |
| Sheet resistance value (Ω/□) | 2.5 | 2.5 | 2.5 | 2.5 |
| Emissivity | 0.03 | 0.03 | 0.03 | 0.03 |

(unit of layer thickness: nm)

| | Examples | | | Comp. Ex. |
|---|---|---|---|---|
| | 38b | 39b | 40b | 6b |
| 11. Top coat (SiN$_x$) | — | — | — | — |
| 10. Titania layer | 33 | 33 | 33 | 33 |
| 9. SiN$_x$ interlayer | 1 | 3 | 5 | — |
| 8. Ag-1 at % Au layer | 14 | 14 | 14 | 14 |
| 7. SiN$_x$ interlayer | 1 | 3 | 5 | — |
| 6. Titania layer | 66 | 66 | 66 | 66 |
| 5. SiN$_x$ interlayer | 1 | 3 | 5 | — |
| 4. Ag-1 at % Au layer | 14 | 14 | 14 | 14 |
| 3. SiN$_x$ interlayer | 1 | 3 | 5 | — |
| 2. Titania layer | 33 | 33 | 33 | 33 |
| 1. Bottom coat (SiN$_x$) | — | — | — | — |
| Visible light transmittance (%) | 76.3 | 76.4 | 76.3 | 70.1 |
| Visible light reflectance (%) | 6.2 | 6.2 | 6.3 | 6.2 |
| Sheet resistance value (Ω/□) | 2.2 | 2.2 | 2.2 | 2.2 |

TABLE 5

| | Examples | | |
|---|---|---|---|
| | 38 | 41 | 42 |
| Visible light transmittance (%) | 74.3 | 74.2 | 72.3 |
| Visible light reflectance (%) | 6.3 | 1.1 | 1.1 |
| Transmittance of light having a wavelength of 900 mm (%) | 14.5 | 9.5 | 4.6 |
| Sheet resistance value (Ω/□) | 2.5 | 2.5 | 2.5 |

TABLE 6

| | Examples | | | | | | Comp. Ex. 6 |
|---|---|---|---|---|---|---|---|
| | 24 | 25 | 28 | 29 | 32 | 33 | |
| Pencil scratch value | 2 H | 2 H | 4 H | 5 H | 5 H | 6 H | B |

TABLE 7

(unit of layer thickness: nm)

| | Examples | | | Comp. Ex. 7 |
|---|---|---|---|---|
| | 43 | 44 | 45 | |
| 13. Titania layer | 30 | 30 | 30 | 30 |
| 12. SiN$_x$ interlayer | 1 | — | 1 | — |
| 11. Ag-1 at % Pd layer | 16 | 16 | 16 | 16 |
| 10. SiN$_x$ interlayer | — | 1 | 1 | — |
| 9. Titania layer | 55.5 | 55.5 | 55.5 | 55.5 |
| 8. SiN$_x$ interlayer | 1 | — | 1 | — |
| 7. Ag-1 at % Pd layer | 16 | 16 | 16 | 16 |
| 6. SiN$_x$ interlayer | — | 1 | 1 | — |
| 5. Titania layer | 55.5 | 55.5 | 55.5 | 55.5 |
| 4. SiN$_x$ interlayer | 1 | — | 1 | — |
| 3. Ag-1 at % Pd layer | 16 | 16 | 16 | 16 |
| 2. SiN$_x$ interlayer | — | 1 | 1 | — |
| 1. Titania layer | 30 | 30 | 30 | 30 |
| Visible light transmittance (%) | 64.4 | 64.2 | 68.5 | 59.6 |
| Visible light reflectance (%) | 6.6 | 6.6 | 6.7 | 6.5 |
| Sheet resistance value (Ω/□) | 1.5 | 1.5 | 1.5 | 1.5 |

TABLE 8

| | Examples | | |
|---|---|---|---|
| | 45 | 46 | 47 |
| Visible light transmittance (%) | 68.5 | 68.6 | 67.0 |
| Visible light reflectance (%) | 6.7 | 1.7 | 1.5 |
| Transmittance of light having a wavelength of 900 mm (%) | 2.4 | 2.3 | 0.01 |
| Sheet resistance value (Ω/□) | 1.5 | 1.5 | 1.5 |

TABLE 9

(unit of layer thickness: nm)

|  | Examples | | | | | | | Comp. Ex. | | |
| --- | --- | --- | --- | --- | --- | --- | --- | --- | --- | --- |
|  | 48 | 49 | 50 | 51 | 52 | 53 | 54 | 9 | 10 | 11 |
| 17. Titania layer | 30 | 30 | 30 | 30 | 30 | 30 | 30 | 30 | 30 | 30 |
| 16. SiN$_x$ interlayer | 1 | 1 | 1 | 2 | 3 | 4 | 5 | — | — | — |
| 15. Ag-1 at % Pd layer | 20 | 18 | 17 | 20 | 20 | 20 | 20 | 20 | 18 | 17 |
| 14. SiN$_x$ interlayer | 1 | 1 | 1 | 2 | 3 | 4 | 5 | — | — | — |
| 13. Titania layer | 57 | 57 | 57 | 57 | 57 | 57 | 57 | 57 | 57 | 57 |
| 12. SiN$_x$ interlayer | 1 | 1 | 1 | 2 | 3 | 4 | 5 | — | — | — |
| 11. Ag-1 at % Pd layer | 26 | 23 | 19 | 26 | 26 | 26 | 26 | 26 | 23 | 19 |
| 10. SiN$_x$ interlayer | 1 | 1 | 1 | 2 | 3 | 4 | 5 | — | — | — |
| 9. Titania layer | 54 | 54 | 54 | 54 | 54 | 54 | 54 | 54 | 54 | 54 |
| 8. SiN$_x$ interlayer | 1 | 1 | 1 | 2 | 3 | 4 | 5 | — | — | — |
| 7. Ag-1 at % Pd layer | 26 | 24 | 19 | 26 | 26 | 26 | 26 | 26 | 24 | 19 |
| 6. SiN$_x$ interlayer | 1 | 1 | 1 | 2 | 3 | 4 | 5 | — | — | — |
| 5. Titania layer | 57 | 54 | 54 | 57 | 57 | 57 | 57 | 57 | 54 | 54 |
| 4. SiN$_x$ interlayer | 1 | 1 | 1 | 2 | 3 | 4 | 5 | — | — | — |
| 3. Ag-1 at % Pd layer | 20 | 17 | 17 | 20 | 20 | 20 | 20 | 20 | 17 | 17 |
| 2. SiN$_x$ interlayer | 1 | 1 | 1 | 2 | 3 | 4 | 5 | — | — | — |
| 1. Titania layer | 30 | 30 | 30 | 30 | 30 | 30 | 30 | 30 | 30 | 30 |
| Visible light transmittance (%) | 43.8 | 49.5 | 55.6 | 43.8 | 43.6 | 44.0 | 44 | 28.4 | 34 | 39.4 |
| Visible light reflectance (%) | 7.8 | 7.2 | 7 | 7.8 | 7.9 | 8.0 | 8.1 | 6.8 | 6.7 | 6.5 |
| Sheet resistance value (Ω/□) | 0.5 | 0.7 | 0.9 | 0.5 | 0.5 | 0.5 | 0.5 | 0.5 | 0.7 | 0.9 |

TABLE 10

|  | Examples | | | Comp. Ex. | | |
| --- | --- | --- | --- | --- | --- | --- |
|  | 55 | 56 | 57 | 12 | 13 | 14 |
| Visible light transmittance (%) | 44 | 49.5 | 55.6 | 28.4 | 34 | 39.4 |
| Visible light reflectance (%) | 2.5 | 2.2 | 2 | 1.8 | 1.7 | 1.5 |
| Transmittance of light having a wavelength of 900 mm (%) | 0.0 | 0.0 | 0.28 | 0.0 | 0.0 | 0.3 |
| Sheet resistance value (Ω/□) | 0.5 | 0.7 | 0.9 | 0.5 | 0.7 | 0.9 |

TABLE 11

(unit of layer thickness: nm)

|  | Examples | | | | |
| --- | --- | --- | --- | --- | --- |
|  | 58 | 59 | 60 | 61 | 62 |
| 5. Titania layer | 33 | 33 | 33 | 33 | 33 |
| 4. SiN$_x$ interlayer | 2.0 | 3.0 | 2.0 | 2.5 | 3.0 |
| 3. Ag-1 at % Pd layer | 14 | 14 | 14 | 14 | 14 |
| 2. SiN$_x$ interlayer | — | — | 2.0 | 2.5 | 3.0 |
| 1. First (TiO$_2$) layer | 33 | 33 | 33 | 33 | 33 |
| Visible light transmittance (%) | 83.3 | 83.3 | 84.8 | 84.9 | 84.7 |
| Visible light reflectance (%) | 4.8 | 4.8 | 4.8 | 4.7 | 4.8 |
| Sheet resistance value (Ω/□) | 5.0 | 4.9 | 5.1 | 5.1 | 5 |
| Emissivity | 0.06 | 0.06 | 0.06 | 0.06 | 0.06 |

TABLE 12

(unit of layer thickness: nm)

|  | Comp. Ex. | |
| --- | --- | --- |
|  | 15 | 16 |
| 5. Titania layer | 33 | 31.5 |
| 4. Ti Layer | — | 1.5 |
| 3. Ag-1 at % Pd layer | 14 | 14 |
| 2. SiN$_x$ interlayer | — | — |
| 1. First (TiO$_2$) layer | 33 | 33 |
| Visible light transmittance (%) | 79.8 | 81.6 |
| Visible light reflectance (%) | 5.6 | 5.1 |
| Sheet resistance value (Ω/□) | 520 | 4.9 |
| Emissivity | 8.2 | 0.06 |

TABLE 13

(unit of layer thickness: nm)

|  | Examples | | | | | | | | | |
| --- | --- | --- | --- | --- | --- | --- | --- | --- | --- | --- |
|  | 63 | 64 | 65 | 66 | 67 | 68 | 69 | 70 | 71 | 72 |
| 5. Titania layer | 33 | 33 | 33 | 33 | 33 | 33 | 33 | 33 | 33 | 33 |
| 4. GZO interlayer | 0.5 | 1 | 1.5 | 2 | 2.5 | 3 | — | — | — | — |
| 3. Ag-1 at % Pd layer | 14 | 14 | 14 | 14 | 14 | 14 | 14 | 14 | 14 | 14 |
| 2. GZO interlayer | — | — | — | — | — | — | 0.5 | 1 | 1.5 | 2 |

TABLE 13-continued (unit of layer thickness: nm)

|  |  |  |  |  |  |  |  |  |  |
|---|---|---|---|---|---|---|---|---|---|
| 1. Titania layer | 33 | 31 | 31 | 30 | 33 | 33 | 33 | 33 | 33 | 33 |
| Visible light transmittance (%) | 83.1 | 83.0 | 83.2 | 83.3 | 83.2 | 83.2 | 83.2 | 83.1 | 83.1 | 83.2 |
| Visible light reflectance (%) | 4.8 | 4.8 | 4.9 | 4.9 | 4.9 | 4.9 | 4.8 | 4.8 | 4.9 | 4.9 |
| Sheet resistance value (Ω/□) | 5.0 | 5.0 | 5.0 | 5.0 | 5.0 | 4.9 | 5.0 | 5.0 | 5.0 | 5.0 |
| Emissivity | 0.06 | 0.04 | 0.05 | 0.05 | 0.05 | 0.05 | 0.05 | 0.06 | 0.05 | 0.06 |

|  | Examples |  |  |  |  |  |  |  | Comp. Ex. |
|---|---|---|---|---|---|---|---|---|---|
|  | 73 | 74 | 75 | 76 | 77 | 78 | 79 | 80 | 1 |
| 5. Titania layer | 33 | 33 | 33 | 33 | 33 | 33 | 33 | 33 | 33 |
| 4. GZO interlayer | 0.5 | 1 | 1.5 | 2 | 2.5 | 3 | 4 | 5 | — |
| 3. Ag-1 at % Pd layer | 14 | 14 | 14 | 14 | 14 | 14 | 14 | 14 | 14 |
| 2. GZO interlayer | 0.5 | 1 | 1.5 | 2 | 2.5 | 3 | 4 | 5 | — |
| 1. Titania layer | 33 | 31 | 31 | 30 | 33 | 33 | 33 | 33 | 33 |
| Visible light transmittance (%) | 84.7 | 84.7 | 84.8 | 84.7 | 84.8 | 84.9 | 85.0 | 84.8 | 81.4 |
| Visible light reflectance (%) | 4.9 | 4.8 | 4.9 | 5.0 | 4.9 | 4.9 | 5.0 | 5.0 | 5.0 |
| Sheet resistance value (Ω/□) | 5.0 | 5.0 | 5.0 | 5.0 | 4.9 | 4.9 | 4.9 | 4.8 | 5.0 |
| Emissivity | 0.06 | 0.05 | 0.05 | 0.05 | 0.06 | 0.06 | 0.05 | 0.05 | 0.06 |

TABLE 14

(unit of layer thickness: nm)

|  | Examples |  |  |  |  |  |  |  |  |  |  |  |
|---|---|---|---|---|---|---|---|---|---|---|---|---|
|  | 64 | 66 | 68 | 81 | 82 | 83 | 84 | 85 | 86 | 87 | 88 | 89 |
| 5. Titania layer | 33 | 33 | 33 | 33 | 33 | 33 | 33 | 33 | 33 | 33 | 33 | 33 |
| 4. GZO interlayer | 1 | 2 | 3 | 4 | 5 | 6 | 8 | 10 | 12.5 | 15 | 17.5 | 20 |
| 3. Ag-1 at % Pd layer | 14 | 14 | 14 | 14 | 14 | 14 | 14 | 14 | 14 | 14 | 14 | 14 |
| 2. GZO interlayer | — | — | — | — | — | — | — | — | — | — | — | — |
| 1. Titania layer | 33 | 33 | 33 | 33 | 33 | 33 | 33 | 33 | 33 | 33 | 33 | 33 |
| Pencil scratch value | H | H | H | H | 4H | 4H | 4H | 5H | 5H | 6H | 6H | 6H |
| Laminate | A-64 | A-66 | A-68 | A-81 | A-82 | A-83 | A-84 | A-85 | A-86 | A-87 | A-88 | A-89 |

|  | Examples |  |  |  |  |  |  |  |  |  |  |  |  | Comp. Ex. |
|---|---|---|---|---|---|---|---|---|---|---|---|---|---|---|
|  | 70 | 72 | 90 | 91 | 92 | 93 | 94 | 95 | 96 | 97 | 98 | 99 | 100 | 1 |
| 5. Titania layer | 33 | 33 | 33 | 33 | 33 | 33 | 33 | 33 | 33 | 33 | 33 | 33 | 33 | 33 |
| 4. GZO interlayer | — | — | — | — | — | — | — | — | — | — | — | — | — | — |
| 3. Ag-1 at % Pd layer | 14 | 14 | 14 | 14 | 14 | 14 | 14 | 14 | 14 | 14 | 14 | 14 | 14 | 14 |
| 2. GZO interlayer | 1 | 2 | 3 | 4 | 5 | 6 | 7 | 8 | 9 | 10 | 11 | 12 | 13 | — |
| 1. Titania layer | 33 | 33 | 33 | 33 | 33 | 33 | 33 | 33 | 33 | 33 | 33 | 33 | 33 | 33 |
| Pencil scratch value | HB | HB | HB | HB | HB | HB | HB | HB | HB | HB | HB | HB | HB | B |
| Laminate | A-70 | A-72 | A-90 | A-91 | A-92 | A-93 | A-94 | A-95 | A-96 | A-97 | A-98 | A-99 | A-100 | B-1 |

TABLE 15

(unit of layer thickness: nm)

|  | Examples |  |  |  |  |  |  |  |  |  |  |
|---|---|---|---|---|---|---|---|---|---|---|---|
|  | 101 | 102 | 103 | 104 | 105 | 106 | 107 | 108 | 109 | 110 | 111 |
| 9. Titania layer | 33 | 33 | 33 | 33 | 33 | 33 | 33 | 33 | 33 | 33 | 33 |
| 8. GZO interlayer | — | — | — | — | — | — | 1 | 3 | — | — | 1 |
| 7. Ag-1 at % Pd layer | 14 | 14 | 14 | 14 | 14 | 14 | 14 | 14 | 14 | 14 | 14 |
| 6. GZO interlayer | — | — | — | — | 1 | 3 | — | — | 1 | 3 | — |
| 5. Titania layer | 66 | 66 | 66 | 66 | 66 | 66 | 66 | 66 | 66 | 66 | 66 |
| 4. GZO interlayer | — | — | 1 | 3 | — | — | — | — | — | — | 1 |
| 3. Ag-1 at % Pd layer | 14 | 14 | 14 | 14 | 14 | 14 | 14 | 14 | 14 | 14 | 14 |
| 2. GZO interlayer | 1 | 3 | — | — | — | — | — | — | 1 | 3 | — |
| 1. Titania layer | 33 | 33 | 33 | 33 | 33 | 33 | 33 | 33 | 33 | 33 | 33 |
| Visible light transmittance (%) | 69.3 | 69.4 | 69.7 | 70.0 | 69.4 | 69.6 | 69.5 | 69.5 | 71.0 | 71.3 | 72 |
| Visible light reflectance (%) | 6.2 | 6.2 | 6.2 | 6.2 | 6.2 | 6.3 | 6.2 | 6.3 | 6.2 | 6.2 | 6.2 |
| Sheet resistance value (Ω/□) | 2.5 | 2.5 | 2.5 | 2.5 | 2.5 | 2.5 | 2.5 | 2.5 | 2.5 | 2.5 | 2.5 |
| Emissivity | 0.04 | 0.05 | 0.03 | 0.04 | 0.04 | 0.04 | 0.03 | 0.04 | 0.04 | 0.04 | 0.03 |

TABLE 15-continued (unit of layer thickness: nm)

| | Examples | | | | | | | | | | Comp. Ex. |
|---|---|---|---|---|---|---|---|---|---|---|---|
| | 112 | 113 | 114 | 115 | 116 | 117 | 118 | 119 | 120 | 121 | 6 |
| 9. Titania layer | 33 | 33 | 33 | 33 | 33 | 33 | 33 | 33 | 33 | 33 | 33 |
| 8. GZO interlayer | 3 | — | — | 1 | 3 | 0.5 | 1 | 2 | 3 | 5 | — |
| 7. Ag-1 at % Pd layer | 14 | 14 | 14 | 14 | 14 | 14 | 14 | 14 | 14 | 14 | 14 |
| 6. GZO interlayer | — | — | — | 1 | 3 | 0.5 | 1 | 2 | 3 | 5 | — |
| 5. Titania layer | 66 | 66 | 66 | 66 | 66 | 66 | 66 | 66 | 66 | 66 | 66 |
| 4. GZO interlayer | 3 | 1 | 3 | — | — | 0.5 | 1 | 2 | 3 | 5 | — |
| 3. Ag-1 at % Pd layer | 14 | 14 | 14 | 14 | 14 | 14 | 14 | 14 | 14 | 14 | 14 |
| 2. GZO interlayer | — | 1 | 3 | — | — | 0.5 | 1 | 2 | 3 | 5 | — |
| 1. Titania layer | 33 | 33 | 33 | 33 | 33 | 33 | 33 | 33 | 33 | 33 | 33 |
| Visible light transmittance (%) | 72 | 71.2 | 71.4 | 71.2 | 71.9 | 74.8 | 74.9 | 75.3 | 75.1 | 75.3 | 68.0 |
| Visible light reflectance (%) | 6.3 | 6.1 | 6.2 | 6.2 | 6.3 | 6.2 | 6.2 | 6.3 | 6.4 | 6.5 | 6.2 |
| Sheet resistance value (Ω/□) | 2.5 | 2.5 | 2.5 | 2.5 | 2.5 | 2.5 | 2.5 | 2.5 | 2.4 | 2.4 | 2.5 |
| Emissivity | 0.03 | 0.04 | 0.04 | 0.04 | 0.04 | 0.04 | 0.05 | 0.04 | 0.04 | 0.03 | 0.04 |

TABLE 16

(unit of layer thickness: nm)

| | Examples | | | | | Comp. Ex. |
|---|---|---|---|---|---|---|
| | 122 | 123 | 124 | 125 | 126 | 1 |
| 5. Titania layer | 33 | 33 | 33 | 33 | 33 | 33 |
| 4. NbO$_x$ interlayer | — | — | — | — | — | — |
| 3. Ag-1 at % Pd layer | 14 | 14 | 14 | 14 | 14 | 14 |
| 2. NbO$_x$ interlayer | 0.5 | 1 | 2 | 3 | 4 | — |
| 1. Titania layer | 33 | 33 | 33 | 33 | 33 | 33 |
| Visible light transmittance (%) | 82.8 | 82.7 | 83.2 | 82.9 | 82.9 | 81.4 |
| Visible light reflectance (%) | 4.9 | 4.9 | 4.9 | 5.0 | 5.0 | 5.0 |
| Sheet resistance value (Ω/□) | 5.0 | 5.0 | 5.0 | 5.0 | 5.0 | 5.0 |
| Emissivity | 0.06 | 0.06 | 0.06 | 0.05 | 0.05 | 0.06 |

TABLE 17

(unit of layer thickness: nm)

| | Examples | | | | | Comp. Ex. 1 |
|---|---|---|---|---|---|---|
| | 127 | 128 | 129 | 130 | 131 | |
| 5. Titania layer | 33 | 33 | 33 | 33 | 33 | 33 |
| 4. ITO interlayer | — | — | — | — | — | — |
| 3. Ag-1 at % Pd layer | 14 | 14 | 14 | 14 | 14 | 14 |
| 2. ITO interlayer | 1 | 1.5 | 2 | 3 | 4 | — |
| 1. First (TiO$_2$) layer | 33 | 33 | 33 | 33 | 33 | 33 |
| Visible light transmittance (%) | 82.8 | 82.9 | 83.1 | 83 | 83.1 | 81.4 |
| Visible light reflectance (%) | 4.9 | 4.9 | 4.9 | 5.0 | 5.0 | 5.0 |
| Sheet resistance value (Ω/□) | 5.0 | 5.0 | 5.0 | 5.0 | 4.9 | 5.0 |
| Emissivity | 0.06 | 0.06 | 0.06 | 0.05 | 0.05 | 0.06 |

What is claimed is:

1. A laminate which comprises a substrate, and a titanium oxide layer, a metal layer and a titanium oxide layer laminated alternately in this order on the substrate in (2n+1) layers (wherein n is a positive integer), wherein an interlayer having a refractive index of less than 2.4 at a wavelength of 550 nm is interposed at at least two interlaminar boundaries between the titanium oxide layer and the metal layer, wherein each interlayer independently is a layer consisting of at least one member selected from the group consisting of a nitride, an oxynitride, a carbide, a boride, niobium oxide, GZO, and ITO, wherein each metal layer independently is a layer containing silver as the sole or main component, wherein the thickness of each interlayer independently is from 0.1 to 30 nm, wherein both sides of at least one metal layer is sandwiched between interlayers, wherein the titanium oxide layer closest to the substrate and the titanium oxide layer furthest from the substrate each independently has a thickness of from 20 to 60 nm, and all other titanium oxide layers each independently has a thickness of from 40 to 120 nm, and which laminate contains at least two metal layers.

2. The laminate according to claim 1, wherein each of the titanium oxide layers has a refractive index of at least 2.4 at a wavelength of 550 nm.

3. The laminate according to claim 1, wherein the sheet resistance value is from 0.5 to 3.5 Ω/□, the visible light transmittance is at least 40%, and the visible light reflectance is at most 10%.

4. The laminate according to claim 1, wherein a resin film having a low-reflecting property is further laminated thereon.

5. The laminate according to claim 1, wherein a resin film having a near-infrared shielding property is further laminated thereon.

6. The laminate according to claim 1, wherein the visible light reflectance is at most 3%.

7. The laminate according to claim 1, which contains at least three metal layers.

8. The laminate according to claim 7, which contains at least four metal layers.

9. The laminate according to claim 1, wherein all metal layers are sandwiched between two interlayers.

10. The laminate according to claim 1, wherein each metal layer independently is a layer containing Ag—Pd alloy (0.1 to 5 atomic % Pd).

* * * * *